(12) United States Patent
Niina et al.

(10) Patent No.: US 9,299,934 B2
(45) Date of Patent: Mar. 29, 2016

(54) POLYMER FOR ORGANIC ELECTROLUMINESCENT ELEMENTS, AND ORGANIC ELECTROLUMINESCENT ELEMENT USING CURED PRODUCT OF SAME

(75) Inventors: Masashi Niina, Kitakyushu (JP); Hiroyuki Hayashida, Kitakyushu (JP); Hiroshige Tanaka, Kitakyushu (JP); Kazuto Shiraishi, Kitakyushu (JP); Tohru Asari, Kitakyushu (JP); Kazuaki Yoshimura, Kitakyushu (JP)

(73) Assignee: NIPPON STEEL & SUMIKIN CHEMICAL CO., LTD., Tokyo (JP)

( * ) Notice: Subject to any disclaimer, the term of this patent is extended or adjusted under 35 U.S.C. 154(b) by 367 days.

(21) Appl. No.: 14/005,445

(22) PCT Filed: Feb. 7, 2012

(86) PCT No.: PCT/JP2012/052691
§ 371 (c)(1),
(2), (4) Date: Sep. 16, 2013

(87) PCT Pub. No.: WO2012/132556
PCT Pub. Date: Oct. 4, 2012

(65) Prior Publication Data
US 2014/0008624 A1    Jan. 9, 2014

(30) Foreign Application Priority Data
Mar. 31, 2011    (JP) .................. 2011-078381

(51) Int. Cl.
| | |
|---|---|
| H01L 51/50 | (2006.01) |
| H01L 51/00 | (2006.01) |
| C08F 12/26 | (2006.01) |
| C08F 12/32 | (2006.01) |
| C08F 12/34 | (2006.01) |
| C08F 220/32 | (2006.01) |
| C08F 226/06 | (2006.01) |
| C09K 11/06 | (2006.01) |
| H05B 33/22 | (2006.01) |
| C09B 57/00 | (2006.01) |
| C09D 125/18 | (2006.01) |

(52) U.S. Cl.
CPC ............ *H01L 51/0043* (2013.01); *C08F 12/26* (2013.01); *C08F 12/32* (2013.01); *C08F 12/34* (2013.01); *C08F 220/32* (2013.01); *C08F 226/06* (2013.01); *C09B 57/00* (2013.01); *C09D 125/18* (2013.01); *C09K 11/06* (2013.01); *H01L 51/004* (2013.01); *H01L 51/0042* (2013.01); *H05B 33/22* (2013.01); *C09K 2211/1466* (2013.01); *H01L 51/0072* (2013.01); *H01L 51/5056* (2013.01)

(58) Field of Classification Search
None
See application file for complete search history.

(56) References Cited

U.S. PATENT DOCUMENTS

| | | |
|---|---|---|
| 5,942,340 A | 8/1999 | Hu et al. |
| 2004/0137271 A1 | 7/2004 | Sohn et al. |
| 2006/0128969 A1 | 6/2006 | Li et al. |
| 2012/0313513 A1 | 12/2012 | Tanaka et al. |

FOREIGN PATENT DOCUMENTS

| | | | |
|---|---|---|---|
| JP | 11-176578 A | 7/1999 | |
| JP | 2003-338378 | * 11/2003 | ............. C09K 11/06 |
| JP | 2003-338378 A | 11/2003 | |
| JP | 2004-199935 A | 7/2004 | |
| JP | 2004-204234 A | 7/2004 | |

(Continued)

OTHER PUBLICATIONS

Akimoto et al., Syntheses and properties of copolymers containing indolocarbazole moiety in the side chain, 2011, Polymer Journal, vol. 43, pp. 959-965.*

(Continued)

*Primary Examiner* — Gregory Clark
(74) *Attorney, Agent, or Firm* — Cheng Law Group, PLLC

(57) ABSTRACT

Provided are a polymer for an organic electroluminescent element, which has high light emission efficiency and is applicable to a wet process, a cured product thereof, and an organic electroluminescent element using the cured product. The polymer for an organic electroluminescent element is represented by the following general formula (1) and includes an indolocarbazole skeleton and a polymerizable group as pendants in a repeating unit constituting a main chain, in which the polymer has a weight-average molecular weight of 1,000 to 1,000,000. An organic electroluminescent element that uses the cured product of the polymer for an organic electroluminescent element in an organic layer is also disclosed.

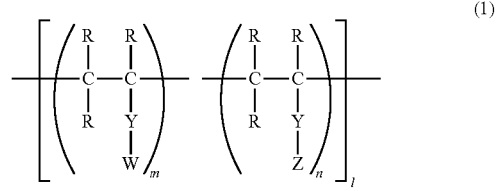

(1)

R's each represent a hydrogen atom or a monovalent organic group, Y represents a divalent linking group, Z represents a substituted or unsubstituted indolocarbazolyl group having a bonding hand at an N-position, W represents a polymerizable group, m and n represent abundance molar ratios, and m represents 1 to 95 mol % and n represents 5 to 99 mol %, and l represents an average number of repetitions and represents 2 to 10,000.

9 Claims, No Drawings

(56) References Cited

FOREIGN PATENT DOCUMENTS

| | | |
|---|---|---|
| JP | 2006-183048 A | 7/2006 |
| JP | 2009-16739 A | 1/2009 |
| JP | 2009-252944 A | 10/2009 |
| WO | WO-2011/105204 A1 | 9/2011 |

OTHER PUBLICATIONS

International Search Report for the Application No. PCT/JP2012/052691 mailed Mar. 27, 2012.
English Translation of Written Opinion of the International Searching Authority (PCT/ISA/237) for Application No. PCT/JP2012/052691 mailed Oct. 10, 2013.

* cited by examiner

POLYMER FOR ORGANIC ELECTROLUMINESCENT ELEMENTS, AND ORGANIC ELECTROLUMINESCENT ELEMENT USING CURED PRODUCT OF SAME

TECHNICAL FIELD

The present invention relates to a polymer containing an indolocarbazole skeleton and a polymerizable group, a cured product obtained by forming the polymer into a film through a wet process and curing the film, and an organic electroluminescent element using the cured product.

BACKGROUND ART

In general, an electroluminescent element includes an inorganic electroluminescent element using an inorganic compound in a light emitting element and an organic electroluminescent element using an organic compound in a light emitting element. In recent years, active studies on practical realization of the organic electroluminescent element have been made because the element can achieve light emission at a low voltage and at a high luminance.

A basic structure of the organic electroluminescent element is obtained by forming a hole injection layer and an organic thin-film layer such as a light emission layer on a glass plate deposited with a thin film of an anode material such as indium-tin oxide (ITO) and further forming a thin film of a cathode material thereon, and there is known an element obtained by appropriately providing a hole transport layer or an electron transport layer on the basic structure. A construction of layers in the organic electroluminescent element is, for example, anode/hole injection layer/light emission layer/electron transport layer/cathode or anode/hole injection layer/hole transport layer/light emission layer/electron transport layer/cathode.

In recent years, it has been found that when charge transport layers such as the hole injection layer and the hole transport layer are integrated between the light emission layer and the anode, the layer improves an ability to inject holes into the light emission layer and serves as a buffer layer that optimizes a charge balance to significantly improve light emission efficiency and life of the element.

Hole transporting materials used in the hole transport layer of the organic electroluminescent element are broadly classified into a low-molecular-weight hole transporting material and a high-molecular-weight hole transporting material.

As a method of forming the low-molecular-weight hole transporting material into a film serving as the hole transport layer, a vacuum deposition method is mainly used and has the following characteristics. According to the method, it is easy to produce a multilayer using various materials having different functions, which allows a high-performance organic electroluminescent element to be formed. However, there is a problem in that it is difficult to control a thickness uniformly and to apply different materials depending on parts for achieving a large-screen and high-definition panel, and a large-size vacuum apparatus is required, resulting in an increase in production cost.

Further, as the method of forming the low-molecular-weight hole transporting material into a film serving as the hole transport layer, a film formation method involving application of a solution containing the low-molecular-weight hole transporting material has been studied toward practical use. However, it is necessary to improve this technique for practical use because segregation and phase separation due to crystallization of the low-molecular-weight compound are observed.

On the other hand, as a method of forming the high-molecular-weight hole transporting material into a film, a solution application method such as a spin coating method, a printing method, or an ink-jet method is used because most of the material cannot be deposited by the vacuum deposition method. The method facilitates an increase in screen size and is excellent in mass productivity. In contrast, the method involves the following problems. Layers are liable to mix with each other and hence function separation at an interface between the respective layers by lamination cannot be performed. In addition, properties different from those required in a dry process such as solubility in a solvent are required, and hence a charge injecting material and charge transporting material that can be used in a wet process are limited.

As attempts to express such required properties, for example, Patent Literature 1 reports an acrylic compound or a cured product thereof, and Patent Literature 2 reports an example in which a charge transporting substance having an oxetane group and/or a polymer obtained by subjecting a luminous substance to three-dimensional crosslinking polymerization are each/is used in an organic light emitting element. In addition, Patent Literature 3 reports a cured product using an NPD having a vinyl group. Although function separation by lamination is achieved in an organic electroluminescent element using any such compound, its electron resistance and charge transporting performance are not sufficient, and hence the element has not obtained sufficient properties.

In addition, as a technique of enhancing the light emission efficiency of the organic electroluminescent element, a polymer material having a main chain of a π-conjugated polymer including an indolocarbazole unit excellent in electron resistance and charge transporting performance integrated thereinto, and a light emitting element including the polymer material have been disclosed. That is, Patent Literature 4 discloses a conjugated polymer obtained by bonding an indolocarbazole at 6- and 12-positions, and Patent Literature 5 discloses a conjugated polymer having an N-position substituted indolocarbazole as a main skeleton. Those polymers each improve the electron resistance and the charge transporting performance. However, the π-conjugated polymer containing an indolocarbazole skeleton in its main chain involves the following problem. The polymer has low solubility in an organic solvent and hence it is difficult to form the polymer into a film. Even when the polymer can be formed into a film, the thin film itself does not have any solvent resistance as in any other polymer that can be applied, and hence any other material such as a light emission layer material cannot be formed into a film on the film by an application method after the film formation.

CITATION LIST

Patent Literature

[PTL 1] JP 2009-16739 A
[PTL 2] JP 2004-199935 A
[PTL 3] JP 2009-252944 A
[PTL 4] JP 2004-204234 A
[PTL 5] JP 2006-183048 A

SUMMARY OF INVENTION

The production of a high-performance organic electroluminescent element by a solution application method requires the formation of an organic thin-film layer having high electron resistance and high charge transporting performance, and insoluble in any solvent.

The present invention has been made in view of the above-mentioned problems, and an object of the present invention is to provide a polymer for an organic electroluminescent element, which has high light emission efficiency and is applicable to a wet process, and a cured product thereof. Another object of the present invention is to provide an organic electroluminescent element using the polymer or a cured product thereof, which is used in a lighting device, an image display device, a back light for a display device, and the like.

To achieve the objects, the inventors of the present invention have made extensive studies, and as a result, have found that when a cured product obtained by curing a polymer, which is obtained by introducing an indolocarbazole skeleton and a unit having a polymerizable group to polymer side chains, is used, an organic layer containing any other material can be laminated as an upper layer by application and light emission performance improves. Thus, the inventors have completed the present invention.

The present invention relates to a polymer for an organic electroluminescent element including an indolocarbazole skeleton and a polymerizable group as pendants in a repeating unit constituting a main chain, and an organic electroluminescent element having organic layers between an anode layer and a cathode layer laminated on a substrate, in which at least one of the organic layers contains the polymer or a cured product thereof.

The present invention relates to a polymer for an organic electroluminescent element, which is represented by the following general formula (1), the polymer including an indolocarbazole skeleton and a polymerizable group as pendants in a repeating unit constituting a main chain, in which the polymer has a weight-average molecular weight of 1,000 to 1,000,000:

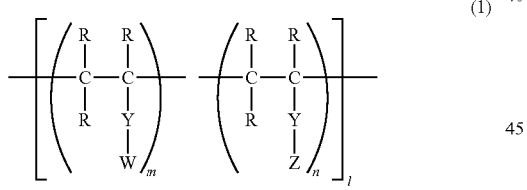

(1)

where, R's each represent a hydrogen atom or a monovalent organic group, Y represents a divalent linking group, Z represents a substituted or unsubstituted indolocarbazolyl group having a bonding hand at an N-position, W represents a polymerizable group, m and n represent abundance molar ratios, and m represents 1 to 95 mol % and n represents 5 to 99 mol %, and l represents an average number of repetitions and represents 2 to 10,000.

In the general formula (1), it is preferred that: R's each represent a hydrogen atom, a $C_1$ to $C_{20}$ alkyl group, a $C_1$ to $C_{20}$ alkoxy group, a $C_6$ to $C_{30}$ aryl group, a $C_6$ to $C_{30}$ aryloxy group, a $C_7$ to $C_{36}$ arylalkyl group, a $C_7$ to $C_{36}$ arylalkyloxy group, a $C_3$ to $C_{30}$ heteroaryl group, a $C_3$ to $C_{30}$ heteroaryloxy group, a $C_4$ to $C_{36}$ heteroarylalkyl group, a $C_4$ to $C_{36}$ heteroarylalkyloxy group, or a $C_3$ to $C_{30}$ cycloalkyl group, and may be identical to or different from each other; and Y represents a single bond, a $C_1$ to $C_{20}$ alkylene group, $R^2$—$Ar^1$—$R^2$, $OR^2$—$Ar^1$, $Ar^1$—$R^2O$, $OR^2$—$Ar^1$—$R^2O$, $O$—$Ar^1$, $Ar^1$—$O$, $O$—$Ar^1$—$O$, $R^2$—$O$—$R^2$, $CO$, or $COO$. In this case, $R^2$'s each independently represent a single bond or a $C_1$ to $C_{10}$ alkylene group, $Ar^1$ represents a $C_6$ to $C_{30}$ arylene group or a $C_3$ to $C_{30}$ heteroarylene group.

In addition, Z in the general formula (1) is preferably selected from indolocarbazolyl groups represented by the following formulae (2) to (7).

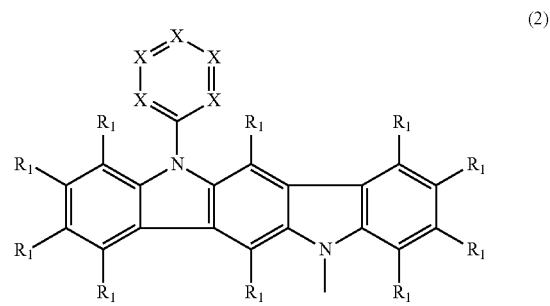

(2)

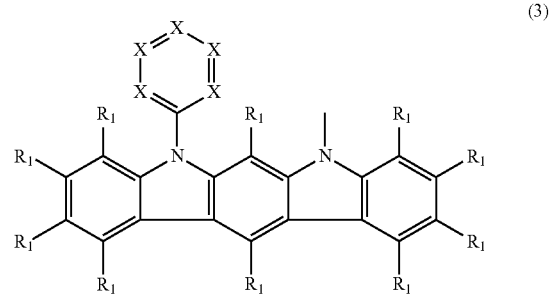

(3)

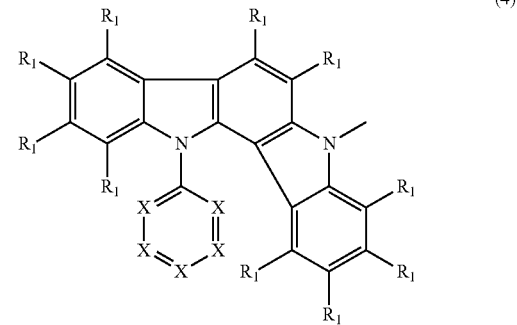

(4)

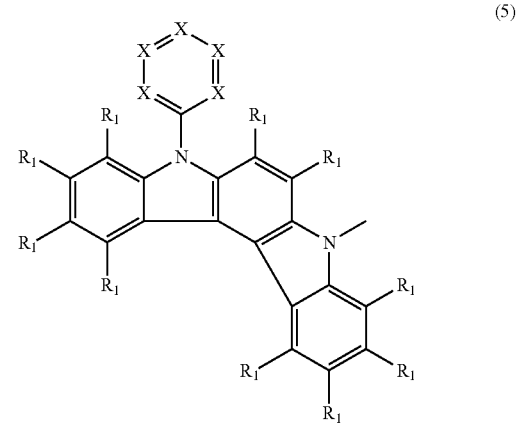

(5)

-continued

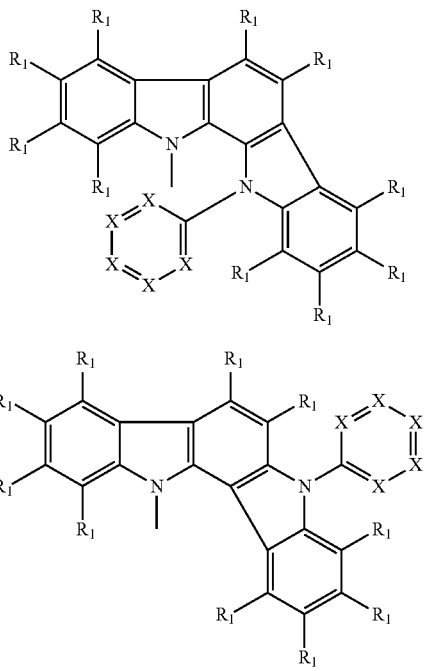

(6)

(7)

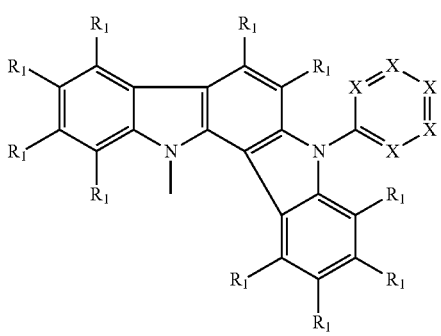

In the formulae (2) to (7), X's each independently represent N or C-L, L's each independently represent a hydrogen atom, a $C_1$ to $C_{20}$ alkyl group, a $C_6$ to $C_{30}$ aryl group, a $C_3$ to $C_{30}$ heteroaryl group, or a $C_{12}$ to $C_{60}$ diarylamino group, $R_1$'s each independently represent a $C_1$ to $C_{20}$ alkyl group, a $C_1$ to $C_{20}$ alkoxy group, a $C_6$ to $C_{30}$ aryl group, a $C_6$ to $C_{30}$ aryloxy group, a $C_7$ to $C_{36}$ arylalkyl group, a $C_7$ to $C_{36}$ arylalkyloxy group, a $C_3$ to $C_{30}$ heteroaryl group, a $C_3$ to $C_{30}$ heteroaryloxy group, a $C_4$ to $C_{36}$ heteroarylalkyl group, a $C_4$ to $C_{36}$ heteroarylalkyloxy group, or a $C_3$ to $C_{30}$ cycloalkyl group.

W in the general formula (1) preferably represents a radically polymerizable group or a cationically polymerizable group, more preferably represents at least one group selected from a vinyl group, a substituted vinyl group substituted with an alkyl group having 1 to 10 carbon atoms, an epoxy group, a substituted epoxy group substituted with an alkyl group having 1 to 10 carbon atoms, an oxetane group, and a substituted oxetane group substituted with an alkyl group having 1 to 10 carbon atoms, and even more preferably represents at least one group selected from a vinyl group, an isopropenyl group, an epoxy group, an oxetane group, and a substituted oxetane group.

The present invention also relates to a cured product, which is obtained by subjecting the polymerizable group of the polymer for an organic electroluminescent element to a reaction to crosslink and cure the polymer.

The present invention also relates to an organic electroluminescent element having organic layers between an anode layer and a cathode layer laminated on a substrate, in which at least one of the organic layers contains a cured product obtained by subjecting the polymerizable group of the polymer for an organic electroluminescent element to a reaction to crosslink and cure the polymer. The organic layer containing the cured product obtained by curing the polymer for an organic electroluminescent element is, for example, a hole transport layer.

DESCRIPTION OF EMBODIMENTS

Hereinafter, an embodiment of the present invention is described in detail.

A polymer of the present invention is an oligomer or polymer represented by the general formula (1). Although the polymer of the present invention is useful as a material for an organic electroluminescent element to be used in an organic layer of an organic electroluminescent element, it is additionally effective to use a cured product of the polymer in the organic layer of the organic electroluminescent element. When the cured product is used, the polymer of the present invention can be said to be a precursor thereof.

The polymer of the present invention has an indolocarbazole skeleton capable of imparting an excellent charge transporting ability, in particular, a hole transporting ability and a polymerizable group in a unit constituting a main chain as pendants (side chains). Here, simultaneous incorporation of a charge transportable group different from the indolocarbazole skeleton into the main chain facilitates the adjustment of, for example, the mobility of charge (a hole mobility in the case of a hole transportable group or an electron mobility in the case of an electron transportable group), which is advantageous for the control of element properties. Here, the term "unit constituting the main chain" means a repeating unit, and the number of kinds of the repeating units is not limited to only one and may be two or more.

In the general formula (1): m and n represent abundance molar ratios, m represents 1 to 95 mol % and n represents 5 to 99 mol % when the total of the repeating units is defined as 100 mol %, m preferably represents 10 to 90 mol %, and more preferably represents 50 to 80 mol %, and n preferably represents 10 to 90 mol %, and more preferably represents 20 to 50 mol %; and l represents the number of repetitions, and the average (number-average) number of repetitions, which is determined by the weight-average molecular weight, is 2 to 10,000, preferably 5 to 1,000.

R's in the general formula (1) each represent a hydrogen atom or a monovalent organic group. As the monovalent organic group, there are given a $C_1$ to $C_{20}$ alkyl group, a $C_1$ to $C_{20}$ alkoxy group, a $C_6$ to $C_{30}$ aryl group, a $C_6$ to $C_{30}$ aryloxy group, a $C_7$ to $C_{36}$ arylalkyl group, a $C_7$ to $C_{36}$ arylalkyloxy group, a $C_3$ to $C_{30}$ heteroaryl group, a $C_3$ to $C_{30}$ heteroaryloxy group, a $C_4$ to $C_{36}$ heteroarylalkyl group, a $C_4$ to $C_{36}$ heteroarylalkyloxy group, or a $C_3$ to $C_{30}$ cycloalkyl group. R's may be identical to or different from each other. When the groups contain a hydrocarbon chain, the hydrocarbon chain may be linear or branched, and may be substituted with a halogen such as Cl or F. R's each preferably represent a hydrogen atom, a $C_1$ to $C_{12}$ alkyl group, a $C_1$ to $C_{12}$ alkoxy group, a $C_6$ to $C_{24}$ aryl group, a $C_6$ to $C_{24}$ aryloxy group, a $C_7$ to $C_{28}$ arylalkyl group, a $C_7$ to $C_{28}$ arylalkyloxy group, a $C_3$ to $C_{24}$ heteroaryl group, a $C_3$ to $C_{24}$ heteroaryloxy group, a $C_4$ to $C_{25}$ heteroarylalkyl group, a $C_4$ to $C_{25}$ heteroarylalkyloxy group, or a $C_3$ to $C_{24}$ cycloalkyl group. In addition, each of the two kinds of repeating units in the general formula (1) includes three R's. It is preferred that two or three of the R's represent hydrogen atoms, and it is more preferred that three of the R's represent hydrogen atoms.

In addition, the groups may have substituents, and in the case where the groups have substituents, the above-mentioned numbers of carbon atoms are calculated from carbon atoms in the groups as well as the substituents. The substituents are not particularly limited as long as they do not inhibit performance, and are preferably a $C_1$ to $C_4$ alkyl group, a phenyl group, a pyridyl group, and a carbazolyl group.

Specific examples of the alkyl group include a methyl group, an ethyl group, a propyl group, a butyl group, a pentyl group, a hexyl group, a heptyl group, an octyl group, a nonyl group, and a decyl group, and preferred specific examples thereof include alkyl groups each having 1 to 8 carbon atoms, such as a methyl group, an ethyl group, a propyl group, a butyl group, a pentyl group, a hexyl group, a heptyl group, and an octyl group. The alkyl chain may be linear or branched.

Specific examples of the alkoxy group include a methyloxy group, an ethyloxy group, a propyloxy group, a butyloxy group, a pentyloxy group, a hexyloxy group, a heptyloxy group, an octyloxy group, a nonyloxy group, and a decyloxy group, and preferred specific examples thereof include alkyloxy groups each having 1 to 8 carbon atoms, such as a methyloxy group, an ethyloxy group, a propyloxy group, a butyloxy group, a pentyloxy group, a hexyloxy group, a heptyloxy group, and an octyloxy group. The alkyl chain may be linear or branched.

Specific examples of the aryl group and the heteroaryl group include groups each produced by removing hydrogen from benzene, pentalene, indene, naphthalene, azulene, heptalene, octalene, indacene, acenaphthylene, phenalene, phenanthrene, anthracene, trindene, fluoranthene, acephenanthrylene, aceanthrylene, triphenylene, pyrene, chrysene, tetraphene, tetracene, pleiadene, picene, perylene, pentaphene, pentacene, tetraphenylene, cholanthrylene, helicene, hexaphene, rubicene, coronene, trinaphthylene, heptaphene, pyranthrene, ovalene, corannulene, fulminene, anthanthrene, zethrene, terrylene, naphthacenonaphthacene, truxene, furan, benzofuran, isobenzofuran, xanthene, oxathrene, dibenzofuran, peri-xanthenoxanthene, thiophene, thioxanthene, thianthrene, phenoxathiin, thionaphthene, isothianaphtene, thiophthene, thiophanthrene, dibenzothiophene, pyrrole, pyrazole, tellurazole, selenazole, thiazole, isothiazole, oxazole, furazan, pyridine, pyrazine, pyrimidine, pyridazine, triazine, indolizine, indole, isoindole, indazole, purine, quinolizine, isoquinoline, carbazole, indolocarbazole, imidazole, naphthyridine, phthalazine, quinazoline, benzodiazepine, quinoxaline, cinnoline, quinoline, pteridine, phenanthridine, acridine, perimidine, phenanthroline, phenazine, carboline, phenotellurazine, phenoselenazine, phenothiazine, phenoxazine, anthyridine, thebenidine, quindoline, quinindoline, acrindoline, phthaloperine, triphenodithiazine, triphenodioxazine, phenanthrazine, anthrazine, benzothiazole, benzimidazole, benzoxazole, benzisoxazole, benzisothiazole, or an aromatic compound in which a plurality of these aromatic rings are linked.

It should be noted that in the case of the group formed from an aromatic compound in which a plurality of the aromatic rings are linked, the number of the aromatic rings to be linked is preferably 2 to 10, more preferably 2 to 7, and the aromatic rings to be linked may be identical to or different from each other. In that case, the position of a bonding hand is not limited and may be a ring at a terminal portion of linked aromatic rings or may be a ring at the central portion thereof. Here, the term "aromatic ring" is a generic term for an aromatic hydrocarbon ring and an aromatic heterocycle. In addition, when the linked aromatic rings include at least one heterocycle, the linked aromatic rings are included in the category of a heteroaryl group.

Here, monovalent groups each produced by removing hydrogen from an aromatic compound in which a plurality of aromatic rings are linked are represented by, for example, the following formulae.

(8)

(9)

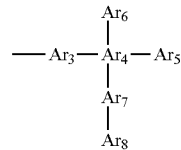

(10)

In the formulae, $Ar_3$ to $Ar_8$ each represent a substituted or unsubstituted aromatic ring.)

Specific examples of the arylalkyl group and the heteroarylalkyl group include groups each obtained by linking the alkyl group to the aryl group or the heteroaryl group.

Specific examples of the aryloxygroup, the arylalkyloxy group, the heteroaryloxy group, and the heteroarylalkyloxy group include groups each obtained by linking an oxy group to the aryl group, the arylalkyl group, the heteroaryl group, or the heteroarylalkyl group.

Specific examples of the cycloalkyl group include a cyclopropyl group, a cyclobutyl group, a cyclopentyl group, a cyclohexyl group, a cycloheptyl group, a cyclooctyl group, and a methylcyclohexyl group, and preferred specific examples thereof include a cyclopentyl group, a cyclohexyl group, and methylcyclohexyl group.

Y in the general formula (1) represents a divalent linking group for linking the main chain and the polymerizable group W or an indolocarbazolyl group. The divalent linking group can be a divalent group or single bond to be adopted when the main chain of the polymer is provided with a target functional group as a pendant. Y represents a single bond, a $C_1$ to $C_{20}$ alkylene group, $R^2$—$Ar^1$—$R^2$, $OR^2$—$Ar^1$, $Ar^1$—$R^2O$, $OR^2$—$Ar^1$—$R^2O$, $Ar^1$—$O$, $O$—$Ar^1$—$O$, $R^2$—$O$—$R^2$, CO, or COO, and preferably represents a single bond, a $C_6$ to $C_{30}$ arylene group, or a $C_3$ to $C_{30}$ heteroarylene group.

Here, $R^2$'s each independently represent a single bond or a $C_1$ to $C_{10}$ alkylene group, and $Ar^1$ represents a $C_6$ to $C_{30}$ arylene group or a $C_3$ to $C_{30}$ heteroarylene group. In addition, when $R^2$ represents a single bond, $R^2$—$Ar^1$—$R^2$ means $Ar^1$ and $R^2$—$O$—$R^2$ means O, and when one of $R^2$'s of each of these groups represents a single bond, the former means $Ar^1$—$R^2$ and the latter means $O$—$R^2$. The same holds true for any other group. It should be noted that preferred examples of the same group as that described for R such as an alkylene group, an arylene group, or a heteroarylene group include similar groups, though the number of carbon atoms may differ.

When any such group includes a hydrocarbon chain, the chain may be linear or may be branched, and the chain may be substituted with a halogen such as Cl or F. In addition, any such group may have a substituent and the substituent is the same as the substituent described for R. The linking group represented by Y is more preferably as short as possible because of the following reason. As the linking group lengthens, a charge transporting ability in the repeating unit reduces and the linking group becomes thermally unstable.

Specific examples of the alkylene group include a methylene group, an ethylene group, a propylene group, a butylene group, a pentylene group, a hexylene group, a heptylene group, an octylene group, a nonylene group, and a decylene group, and preferred specific examples thereof include alkylene groups each having 1 to 8 carbon atoms, such as a methylene group, an ethylene group, a propylene group, a butylene group, a pentylene group, a hexylene group, a heptylene group, and an octylene group. The alkyl chain may be linear or branched.

Specific examples of the arylene group and the heteroarylene group include groups each produced by removing two hydrogen atoms from any one of the aromatic rings exemplified for the aryl group and heteroaryl group each represented by R, or an aromatic compound in which a plurality of these aromatic rings are linked.

None of R and Y has 5 or more heterocyclic structures or a polymerizable group such as an olefinic double bond in itself because it is not desired that R and Y each have the same function as that of W or Z.

Z in the general formula (1) represents an N-position substituted indolocarbazolyl group. The indolocarbazolyl group is a group produced by removing one H atom at the N-position from a condensed ring compound formed of 5 rings in which an indole ring and a carbazole ring are condensed. The indolocarbazolyl group has a plurality of positions where the indole ring and the carbazole ring can be condensed. Therefore, the indolocarbazolyl group may be a group having six kinds of structural isomers represented by the following formulae (A) to (F), and the group may be any of the structural isomers. In addition, the indolocarbazolyl group preferably has a six-membered aromatic group at the other N-position that is not bonded to the main chain. In addition, the indolocarbazole group (including the six-membered aromatic group that is substituted at the other N-position) may have a substituent as long as it does not inhibit the effect of the present invention.

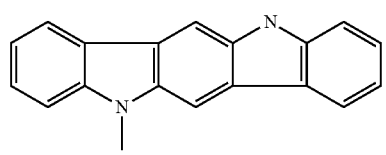

(A)

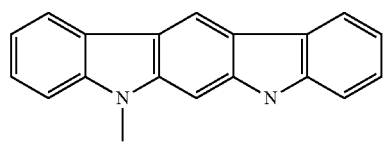

(B)

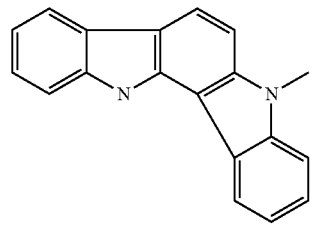

(C)

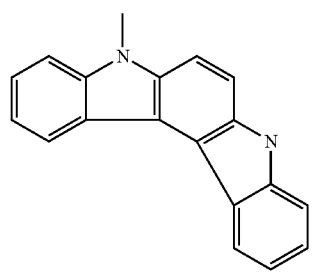

(D)

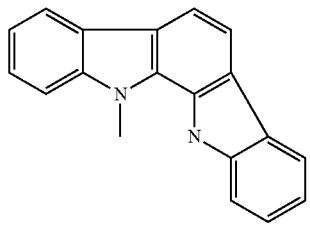

(E)

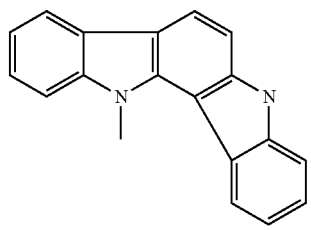

(F)

As the N-position substituted indolocarbazolyl group represented by Z in the general formula (1), there are given any one or two or more of indolocarbazolyl groups selected from the group consisting of structures represented by the formulae (2) to (7). In the case where the N-position substituted indolocarbazolyl group includes two or more indolocarbazolyl groups, Z in the general formula (1) includes two or more kinds of indolocarbazolyl groups.

In the formulae (2) to (7), $R_1$ has the same meaning as that of R in the general formula (1).

In the formulae (2) to (7), X's each independently represent N or C-L. In this case, L's each independently represent a hydrogen atom, a $C_6$ to $C_{30}$ aryl group, a $C_3$ to $C_{30}$ heteroaryl group, or a $C_{12}$ to $C_{60}$ diarylamino group, and preferably represent a hydrogen atom, a $C_6$ to $C_{24}$ aryl group, a $C_3$ to $C_{24}$ heteroaryl group, or a $C_{12}$ to $C_{36}$ diarylamino group.

Here, preferred specific examples of the aryl group of the aryl group, heteroaryl group, or diarylamino group include aryl groups exemplified for the aryl group and heteroaryl group described in the case of R in the general formula (1). As the more preferred aryl group, there are given a group produced by removing hydrogen from benzene, pyridine, pyrazine, pyrimidine, pyridazine, triazine, indole, carbazole, or an aromatic compound in which a plurality of these aromatic rings linked, a diphenylamino group and a dinaphthyl amino group. It should be noted that in the case of a group produced from an aromatic compound in which a plurality of aromatic rings are linked, the number of aromatic rings to be linked is preferably 2 to 10, more preferably 2 to 5. The aromatic rings to be linked may be identical to or different from each other.

In addition, the aryl group of the aryl group, the heteroaryl group, or the diarylamino group may have a substituent. When the aryl group has a substituent, the total number of substituents is 1 to 10, preferably 1 to 6, more preferably 1 to 4. It should be noted that a group produced from an aromatic compound in which a plurality of aromatic rings are linked can also have a substituent. The substituent is not particularly limited, but as a preferred substituent, there are given, for example, an alkyl group having 1 to 20 carbon atoms, an alkoxy group having 1 to 20 carbon atoms, an alkylthio group having 1 to 20 carbon atoms, an alkyl-substituted amino group having 1 to 20 carbon atoms, an acyl group having 2 to 20 carbon atoms, and a diarylamino group having 12 to 24 carbon atoms. As a more preferred substituent, there are given a methyl group, an ethyl group, an n-propyl group, an i-propyl group, an n-butyl group, a t-butyl group, a methoxy group, an ethoxy group, an n-propoxy group, an i-propoxy group, a phenyl group, a pyridyl group, a diphenylamino group, and a carbazolyl group. When the aryl group has two or more substituents, these may be identical to or different from each other.

W in the general formula (1) represents a polymerizable group that can be polymerized with, for example, light, heat, or a catalyst. Preferred examples of the polymerizable group include a radically polymerizable group and a cationically polymerizable group. The radically polymerizable group is preferably a vinyl group or a substituted vinyl group substituted with an alkyl group having 1 to 10 carbon atoms, more preferably a vinyl group or an isopropenyl group. The cationically polymerizable group is preferably a cyclic ether group such as an epoxy group, an oxetane group, a substituted epoxy group substituted with an alkyl group having 1 to 10 carbon atoms, or a substituted oxetane group substituted with an alkyl group having 1 to 10 carbon atoms, and is particularly preferably an oxetane group or a substituted oxetane group substituted with an alkyl group having 1 to 10 carbon atoms because the rate of polymerization can be easily controlled.

Although the repeating unit forming the main chain in the general formula (1) is not particularly limited, a polymer using, as a repeating unit, an ethylene chain or styrene chain obtained by polymerizing a vinyl compound substituted with an indolocarbazolyl group or crosslinking group is preferred from the viewpoints of the ease of polymerization and an improvement in element performance.

In addition, the repeating unit forming the main chain can include any other unit free of Z or W. When the other unit is included, its content is preferably 50 mol % or less. The other unit is, for example, such a unit that Y—W or Y—Z in the general formula (1) represents a hydrogen atom.

Next, a method of producing the polymer represented by the general formula (1) is described. Although the production method is not particularly limited, a method involving copolymerizing a vinyl compound having an indolocarbazole skeleton and a vinyl compound having a polymerizable group is available. Here, the vinyl groups of the vinyl compounds can each be a substituted vinyl group obtained by substituting 1 to 4H atoms of a vinyl group such as a methacryl group or an isopropenyl group. The substituent corresponds to R in the general formula (1).

When a small amount of any other repeating unit is caused to exist, for example, a methacrylate or styrene is desirably used in combination.

Examples of the vinyl compound having an indolocarbazole skeleton are shown below. However, the compound is by no means limited thereto. In addition, here, one kind of the vinyl compounds each having an indolocarbazole skeleton may be used alone, or two or more kinds thereof may be used as a mixture as required.

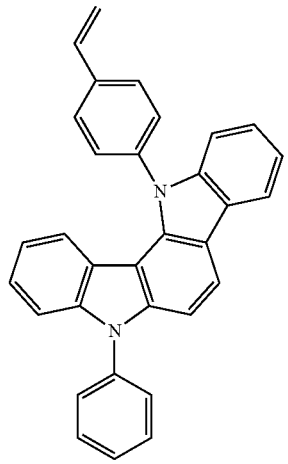

c-1

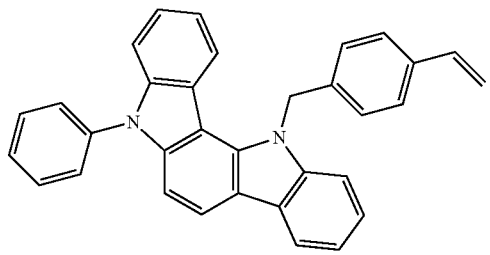

c-2

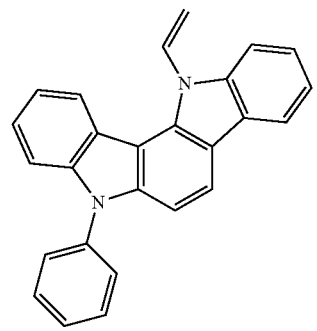

c-3

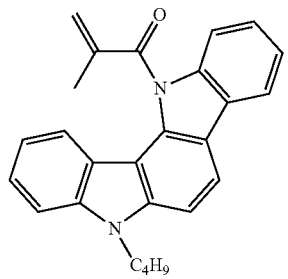

c-4

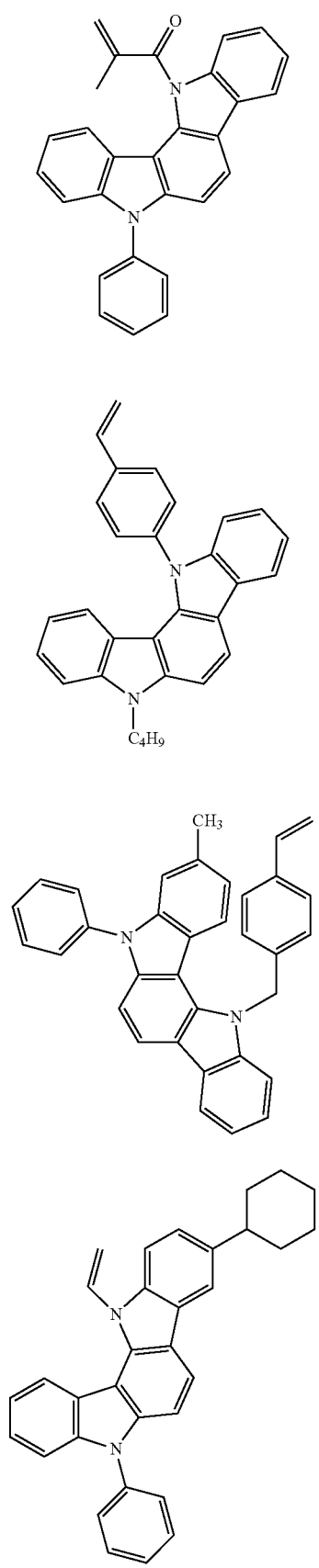
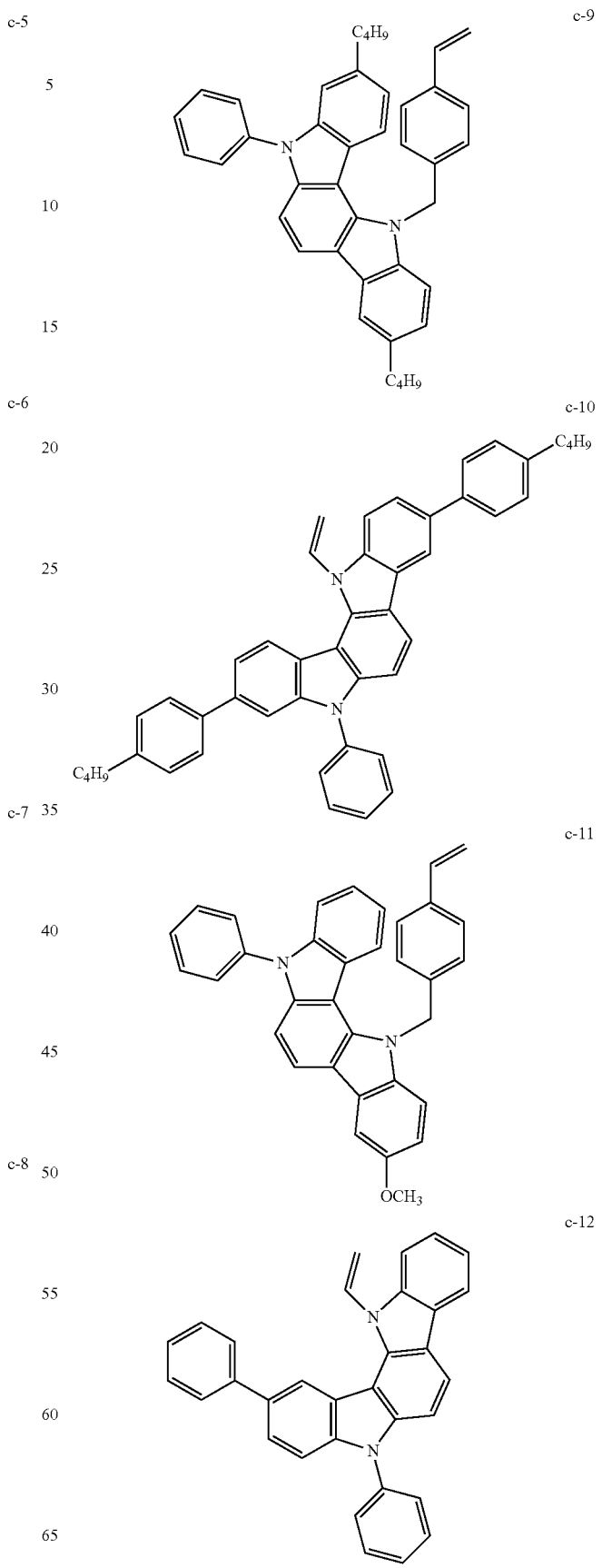

15
-continued
c-13
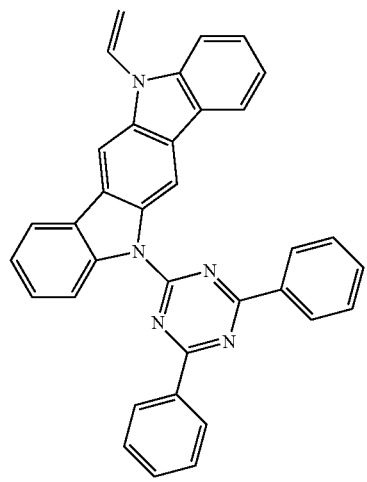
c-14
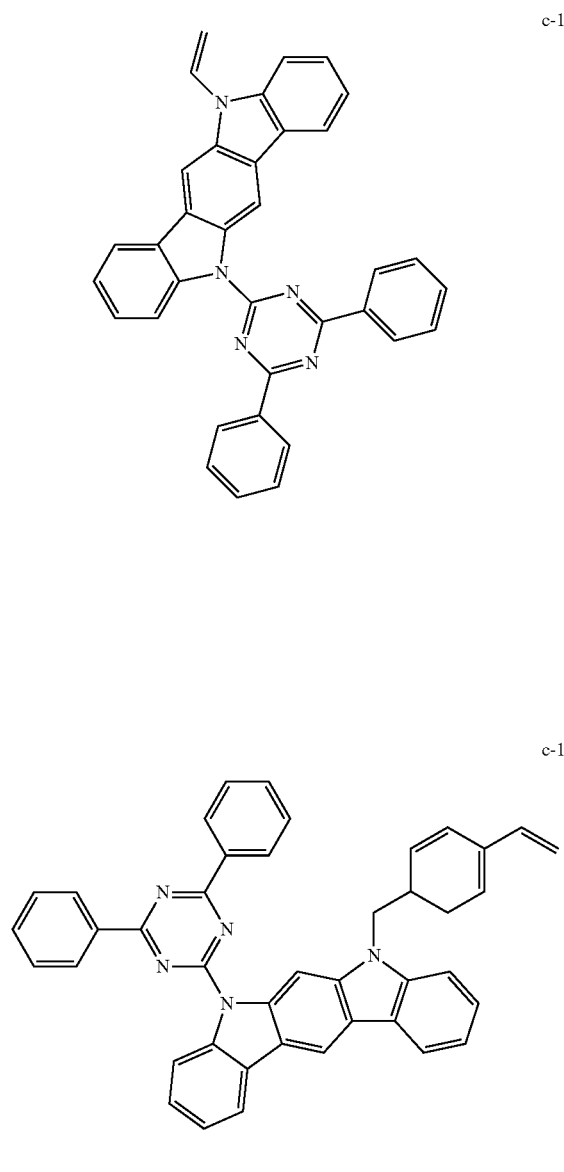
c-15
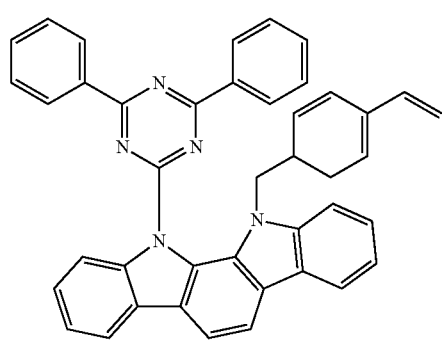
16
-continued
c-16
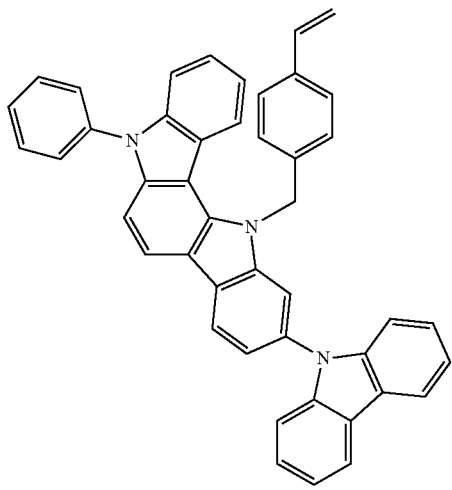
c-17
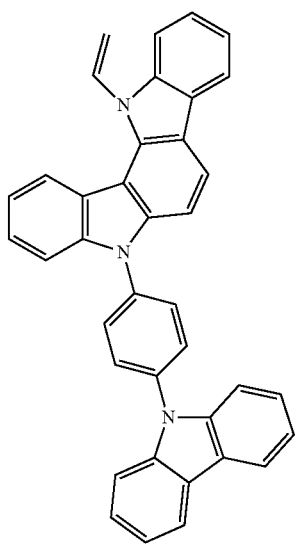
c-18
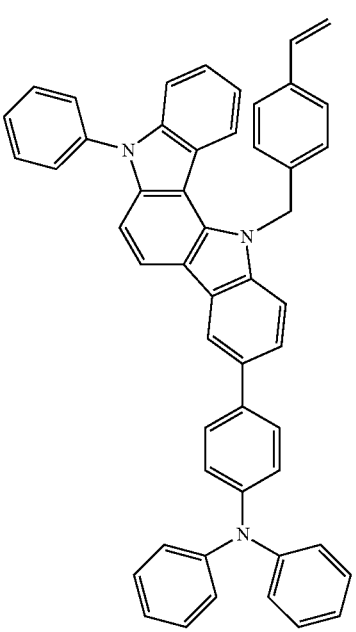

-continued
c-19
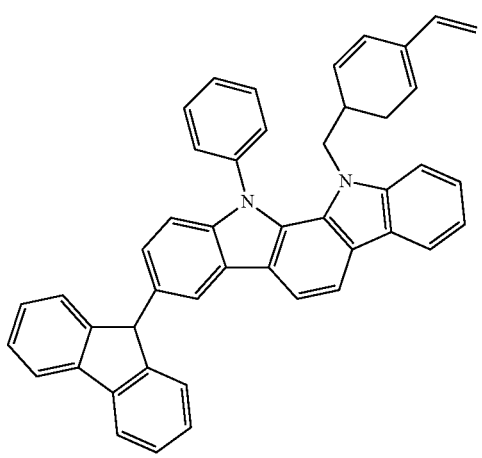
c-20
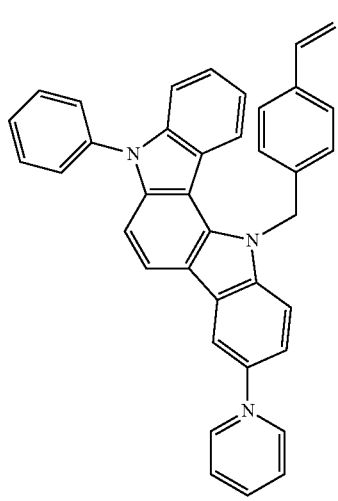
c-21
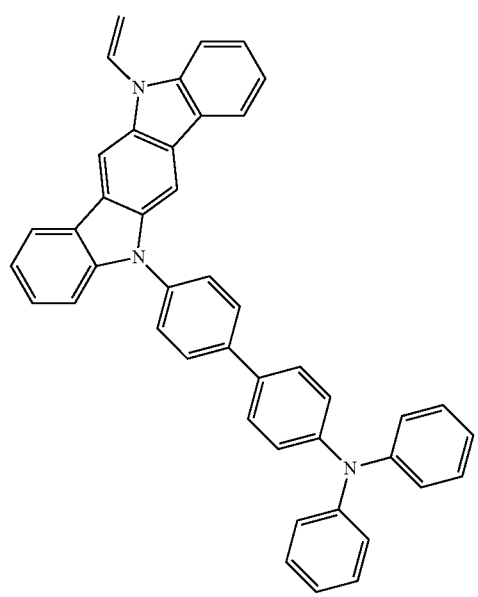
-continued
c-22
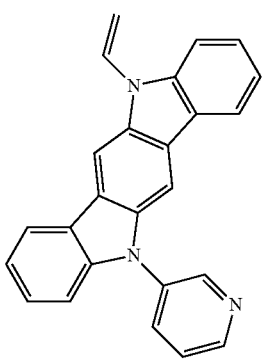
c-23
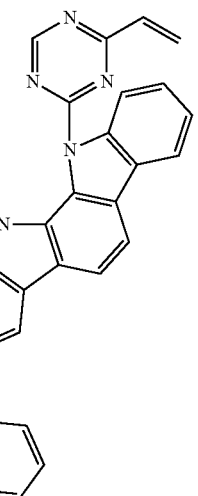
c-24
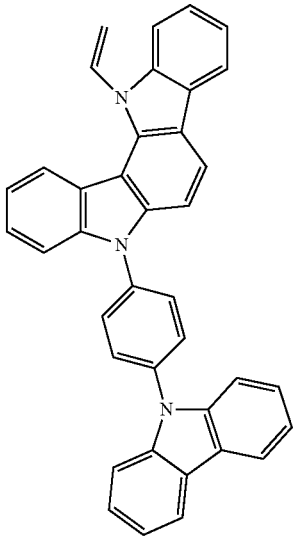

c-25
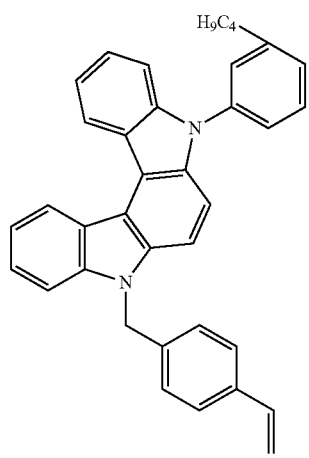
c-28
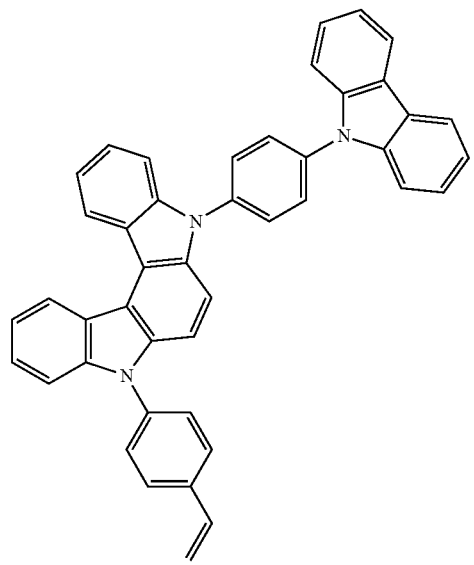
c-26
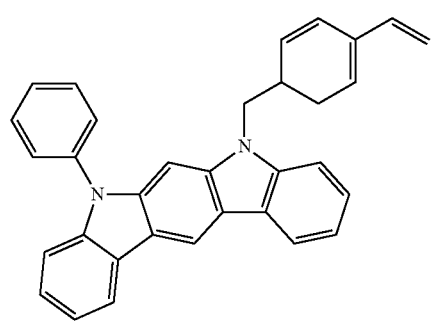
c-29
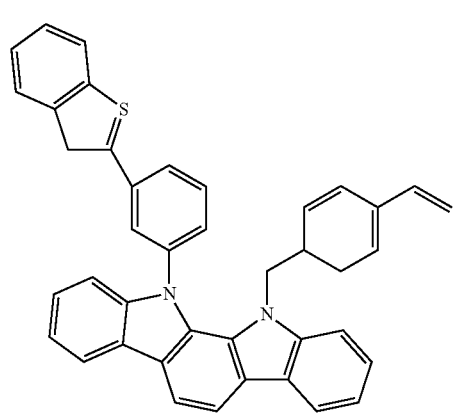
c-27
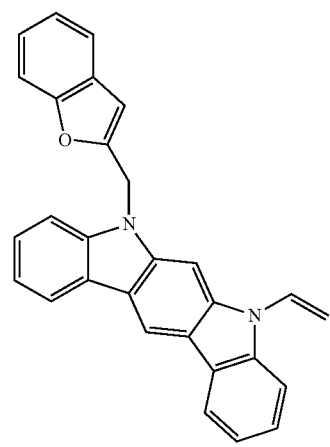
c-30
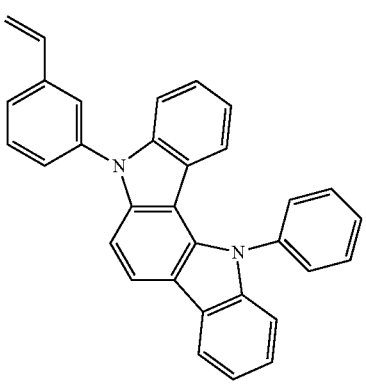

c-31

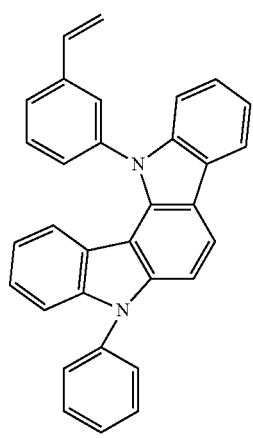

c-32

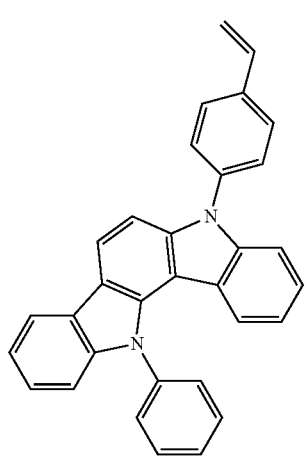

In addition, examples of the vinyl compound having a polymerizable group include, but by no means limited to, vinyl compounds having such crosslinking groups as represented by the following general formulae. In addition, here, one kind of the vinyl compounds each having a polymerizable group may be used alone, or two or more kinds thereof may be used as a mixture as required. Upon synthesis of the polymer represented by the general formula (1) with any such vinyl compound having a polymerizable group, the vinyl group moiety of the vinyl compound reacts to initiate polymerization. When the compound contains two kinds of vinyl groups, one vinyl group remains unreacted as a polymerizable group.

o-1

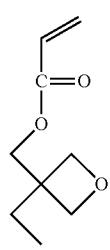

o-2

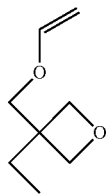

o-3

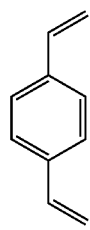

o-4

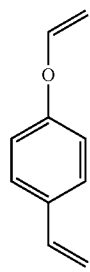

o-5

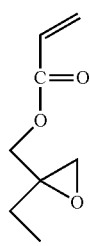

o-6

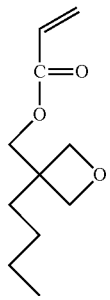

o-7

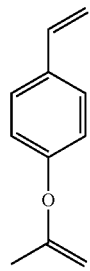

o-8
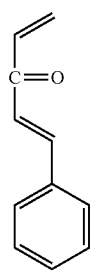
o-9
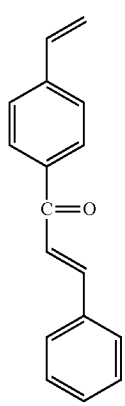
o-10
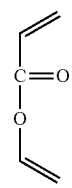
o-11
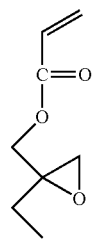
o-12
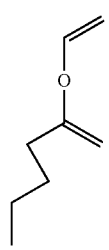
o-13
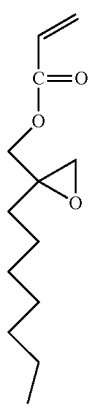
o-14
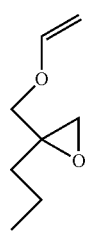
o-15
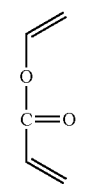
o-16
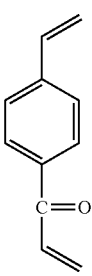
o-17

o-18 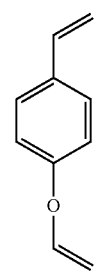

o-19 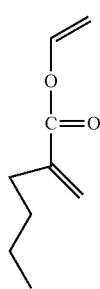

o-20 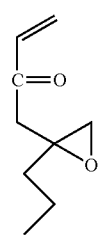

o-21 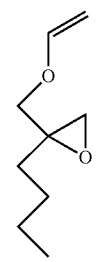

o-22 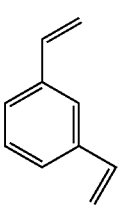

o-23 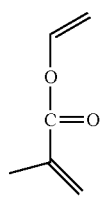

o-24 

o-26 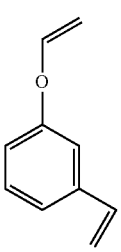

o-27 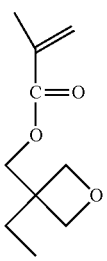

o-28 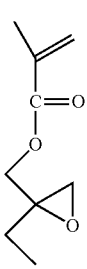

o-29 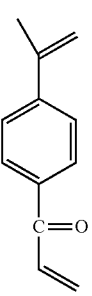

The polymer having an indolocarbazole skeleton and a polymerizable group of the present invention can be easily produced by polymerizing the vinyl groups of the vinyl compound having an indolocarbazole skeleton and the vinyl compound having a polymerizable group according to a known method. For example, the polymer can be produced according to the following reaction formula. A method for the polymerization may be any one of radical polymerization, anion polymerization, cation polymerization, and addition polymerization as long as the polymerization method is such that the polymerization reaction or crosslinking reaction of the polymerizable group serving as W does not occur. For example, when the polymerizable group is a cationically polymerizable oxetane group, radical polymerization or anion polymerization can be employed, and radical polymerization is particularly desirable from a general-purpose viewpoint.

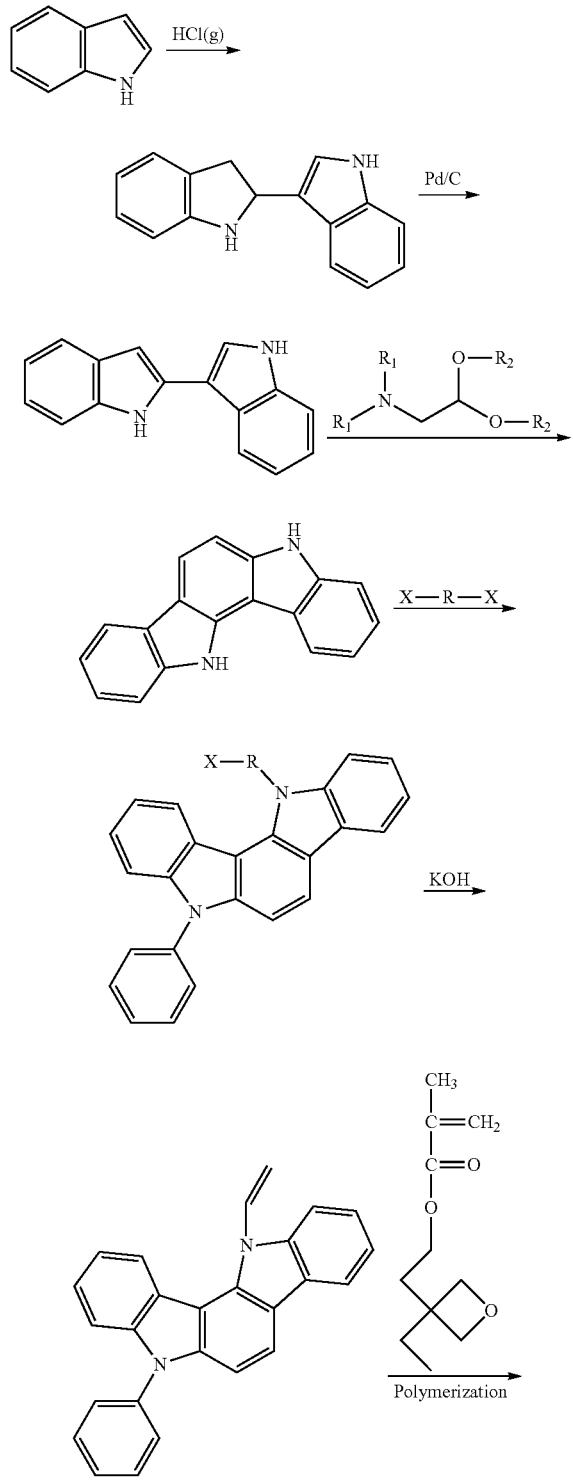

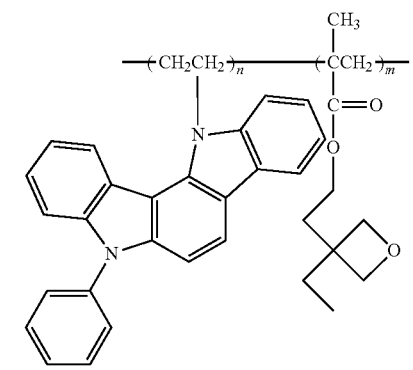

The polymer of the present invention has a weight-average molecular weight (Mw) of 1,000 to 1,000,000, preferably 5,000 to 300,000. When the Mw is less than 1,000, formation of a uniform film is difficult, while when the Mw is more than 1,000,000, solubility in an organic solvent is extremely low, resulting in difficulty in application of a solution.

Hereinafter, examples of the polymer having an indolocarbazole skeleton and a polymerizable group of the present invention are shown, but the polymer is not limited thereto.

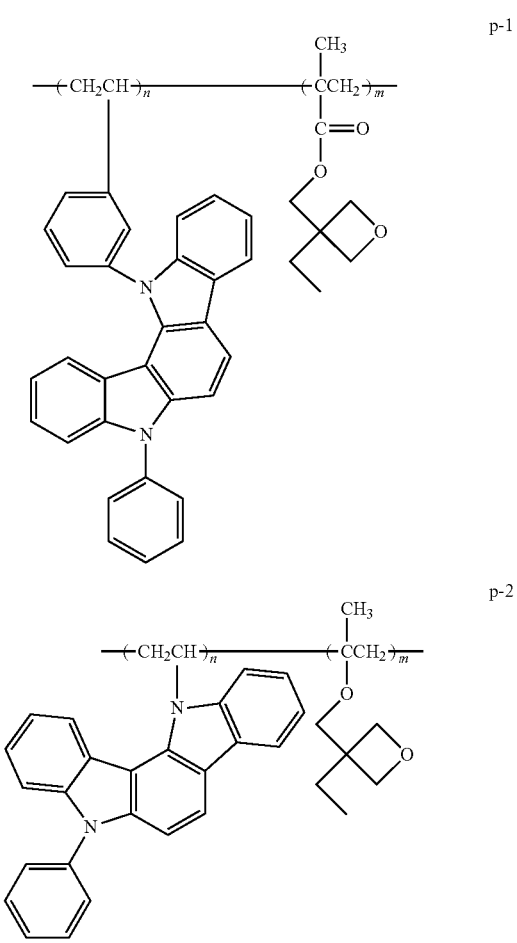

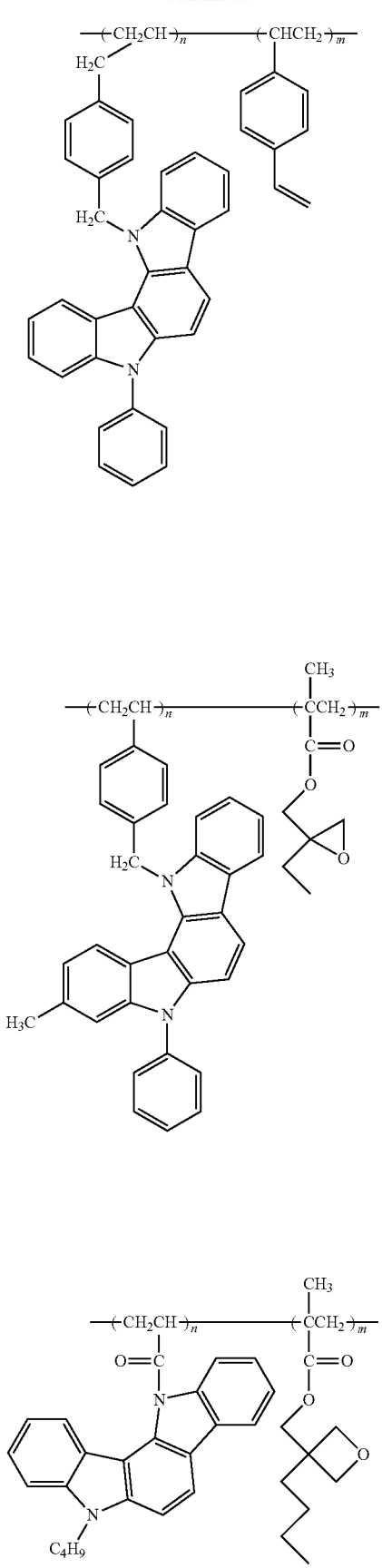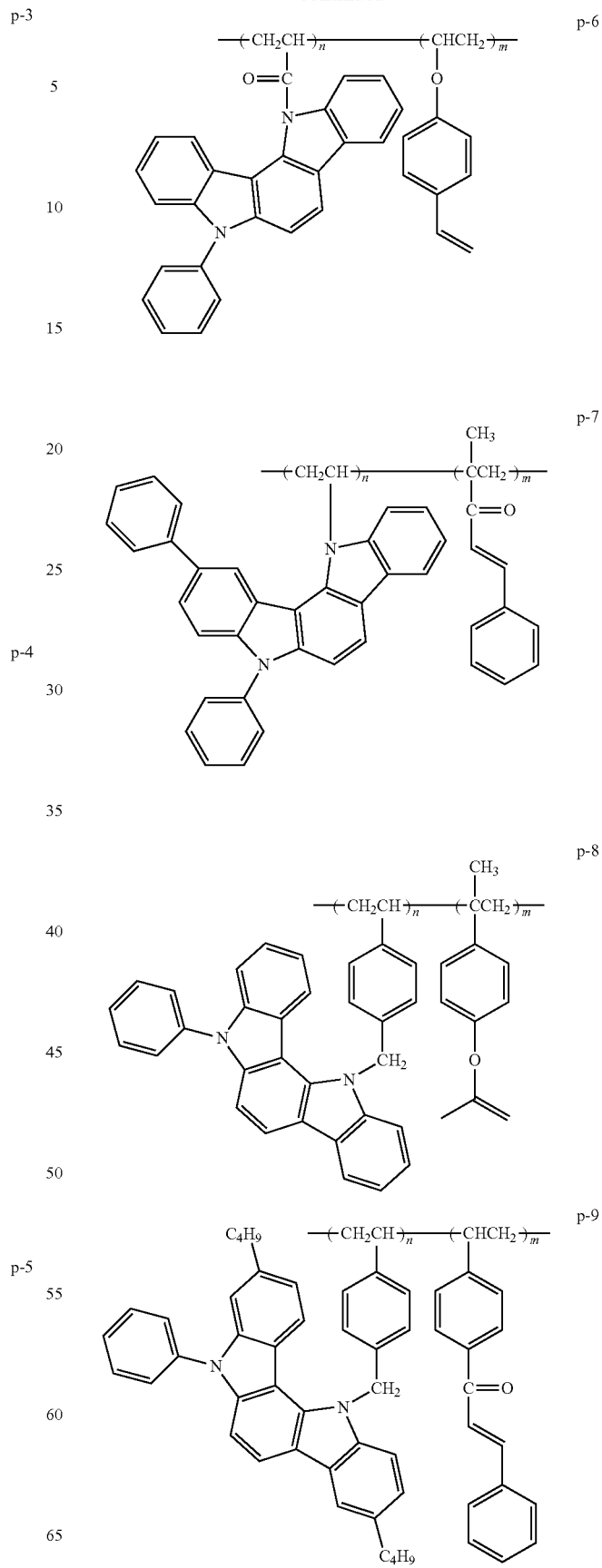

p-10
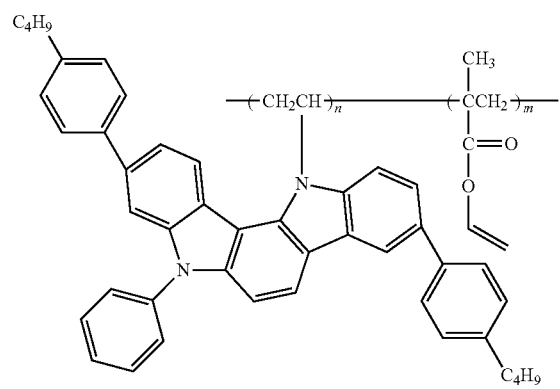
p-11
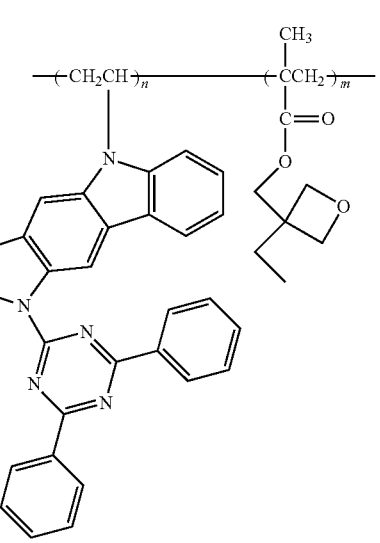
p-12
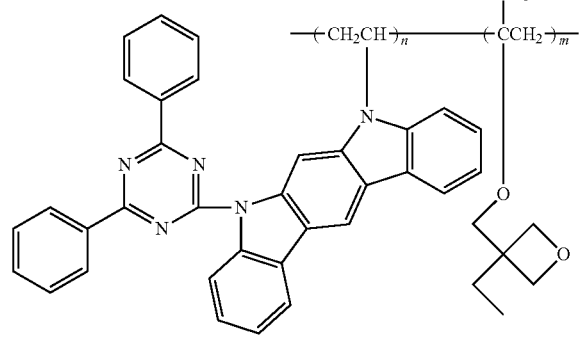
p-13
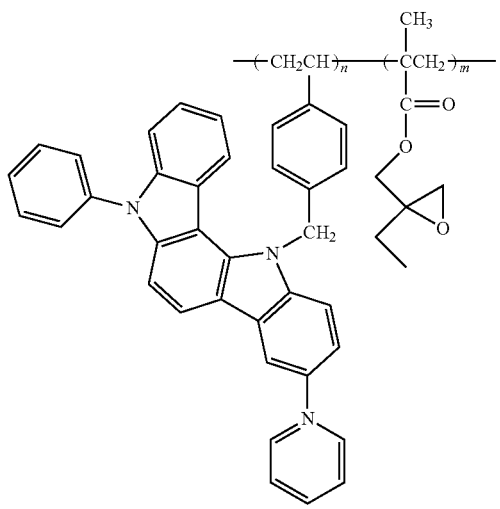
p-14
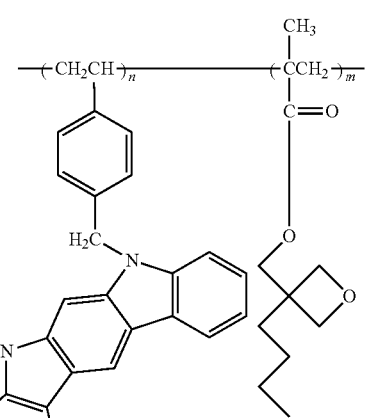
p-15

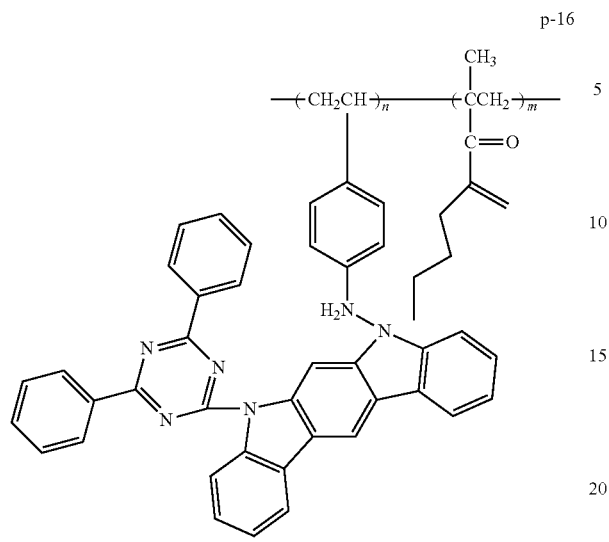
p-16
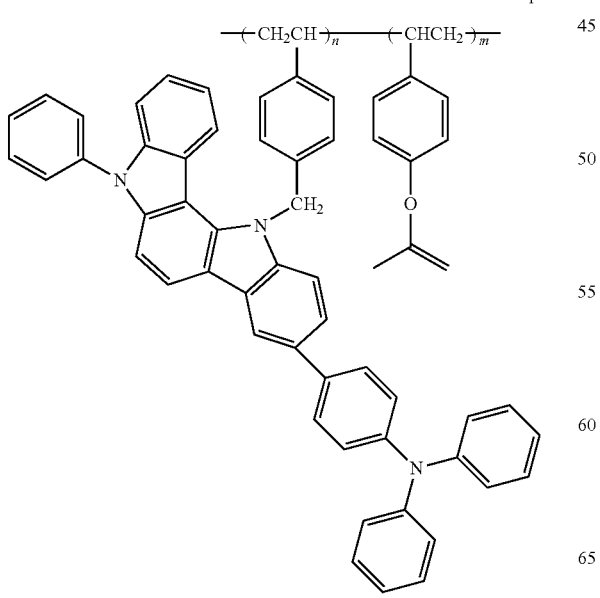
p-17
p-18
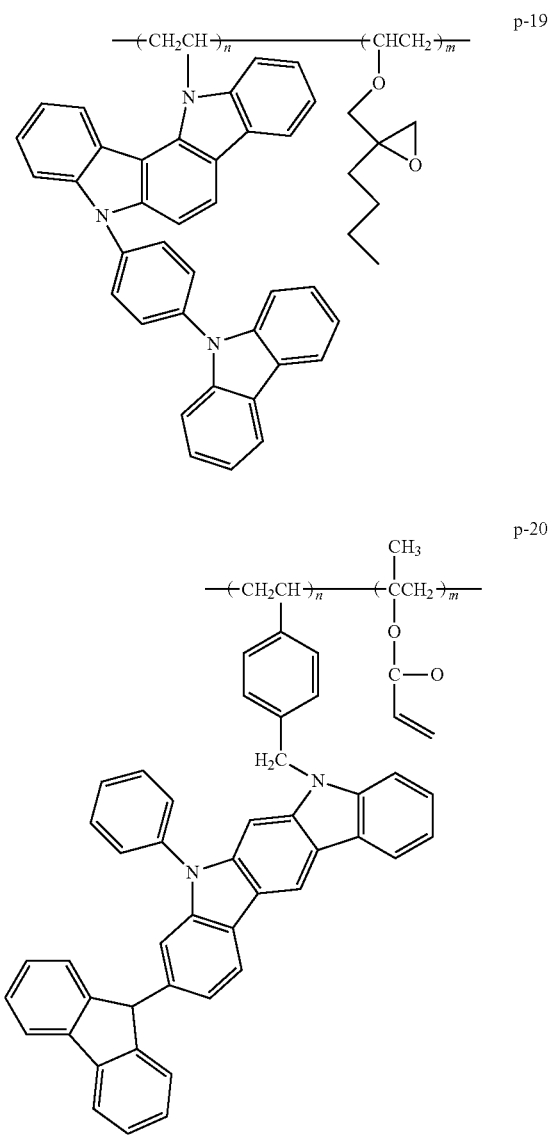
p-19
p-20
p-21 p-22
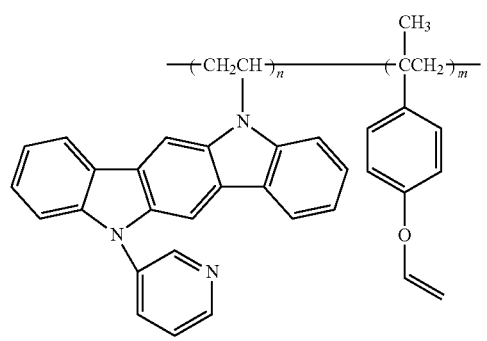

p-23
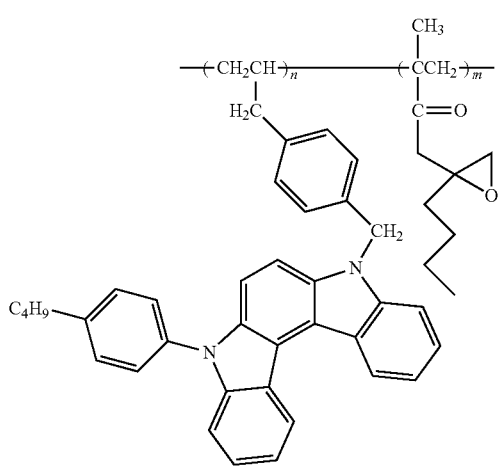

p-24
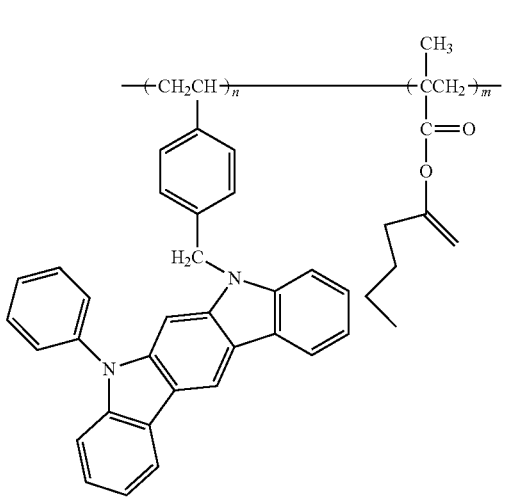

p-25
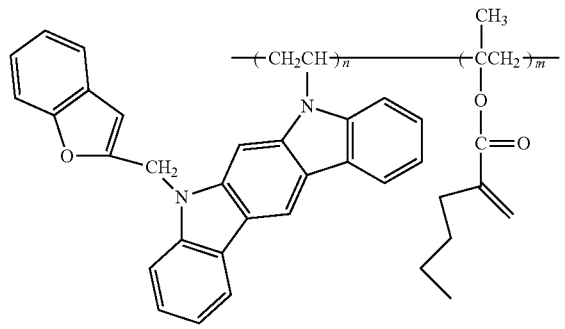

p-26
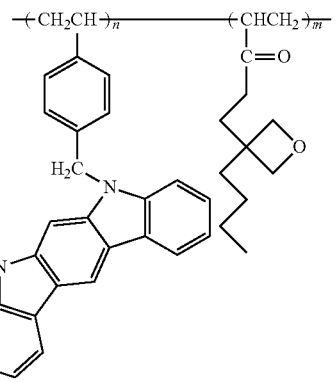

p-27
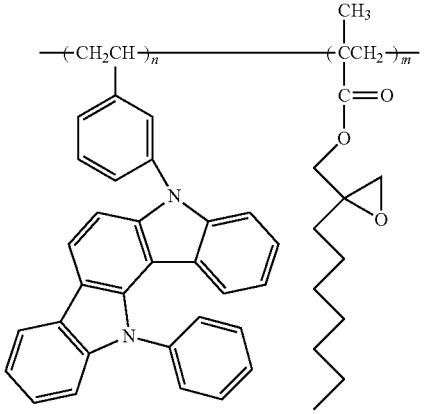

p-28
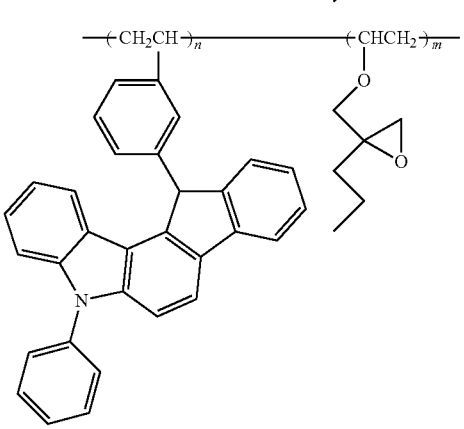

The polymers exemplified in the formulae are shown as polymers polymerized in a block manner. However, the manner of polymerization may be, for example, a random manner or a block manner.

In addition, a method involving subjecting the polymerizable group of the polymer of the present invention to a crosslinking reaction to provide a cured product is, for example, a polymerization reaction with light, heat, or a catalyst. However, when the performance of an organic EL element is adversely affected by a system in which the catalyst is added, polymerization with only light or heat is desirable.

When the polymer or the cured product of the present invention is contained in an organic layer of an organic EL element, an excellent organic electroluminescent element can be provided. The polymer or the cured product is preferably contained in at least one organic layer selected from a light emission layer, a hole transport layer, an electron transport layer, and a hole blocking element layer. The polymer or the cured product is more preferably contained as a material for the hole transport layer.

A cured product, which is obtained by melting the polymer of the present invention or dissolving the polymer in a solvent, forming the melt or solution into a film according to an application method such as a spin coating method, an ink-jet method, a printing method, a spray coating method, or a dispenser method, and crosslinking and curing the film that is in its natural state or has been dried with heat, light, a catalyst, or the like, is desirably incorporated into an organic layer of an organic EL element, though a production method for the cured product is not particularly limited.

Hereinafter, conditions for curing the polymer of the present invention are described. It should be noted that those conditions are applicable irrespective of which polymerizable group is subjected to a crosslinking reaction.

When the polymer of the present invention is heated so as to be cured, heating conditions vary depending on the kind of the polymerizable group.

Although a heating approach is not particularly limited, with regard to the conditions for the heating, a layer formed by using the polymer of the present invention is heated to typically 120° C. or more, preferably 400° C. or less. A time for the heating is typically 1 min or more, preferably 24 hr or less. Although heating means is not particularly limited, for example, the following means is employed: a laminate having the formed layer is mounted on a hot plate or is heated in an oven. For example, the following conditions can be used: the laminate is heated on a hot plate at 120° C. or more for 1 min or more.

When the curing is performed by irradiation with active energy such as light, a method involving irradiating the polymer with the active energy by directly using a UV/visible/infrared light source such as an ultrahigh-pressure mercury lamp, a high-pressure mercury lamp, a halogen lamp, or an infrared lamp, a method involving irradiating the polymer with the active energy by using a mask aligner having built therein the light source or a conveyor-type light irradiation apparatus, or the like is available. In the case of irradiation with active energy except light, for example, a method involving irradiating the polymer with the active energy by using an apparatus that applies a microwave generated with a magnetron, i.e., the so-called microwave oven is available.

With regard to a time for the irradiation, a condition needed for reducing the solubility of the film is preferably set. The irradiation time is typically 0.1 sec or more, preferably 10 hr or less. The heating and the irradiation with active energy such as light may each be performed alone, or may be performed in combination. When the heating and the irradiation are combined, the order in which the heating and the irradiation are performed is not particularly limited.

The heating and the irradiation with active energy including light are preferably performed under an atmosphere free of moisture such as a nitrogen gas atmosphere in order that the amounts/amount of moisture in the layer and/or moisture adsorbing to its surface may be reduced. When the heating and/or the irradiation with active energy such as light are performed in combination, at least a step immediately before the formation of an organic light emission layer is particularly preferably performed under an atmosphere free of moisture such as a nitrogen gas atmosphere for the same purpose.

When the polymer of the present invention is dissolved in the solvent, the polymer is incorporated at typically 0.1 wt % or more, preferably 0.5 wt % or more, more preferably 1 wt % or more, and typically 50 wt % or less, preferably 20 wt % or less, more preferably 10 wt % or less.

Next, an organic electroluminescent element using the cured product of the polymer of the present invention is described.

The organic electroluminescent element using the cured product of the polymer of the present invention has a plurality of organic layers between a pair of an anode and a cathode. In particular, the element preferably includes the hole transport layer/light emission layer and electron transport layer, the hole transport layer and light emission layer/electron transport layer, or the hole transport layer/light emission layer/electron transport layer. The element particularly preferably has a layer structure including the hole transport layer/light emission layer/electron transport layer. In addition, the organic electroluminescent element of the present invention may be produced by forming the organic layers and providing protective layers on the respective layers. Further, a protective film may be provided to protect the whole of the element from moisture or oxygen.

The light emission layer is a layer containing a light emitting material, which may emit fluorescent light or phosphorescent light. In addition, the light emitting material may be used as a dopant, and a host material may be used in combination.

When the light emitting material in the light emission layer is a fluorescent light emitting material, any of the following compounds may be used as the fluorescent light emitting material. However, the material is by no means limited thereto.

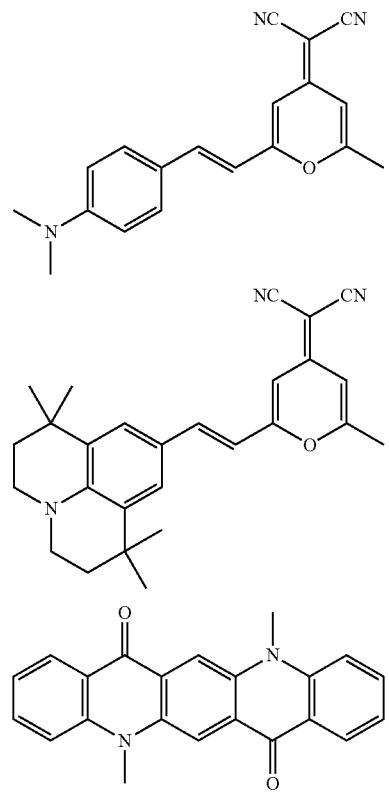

-continued

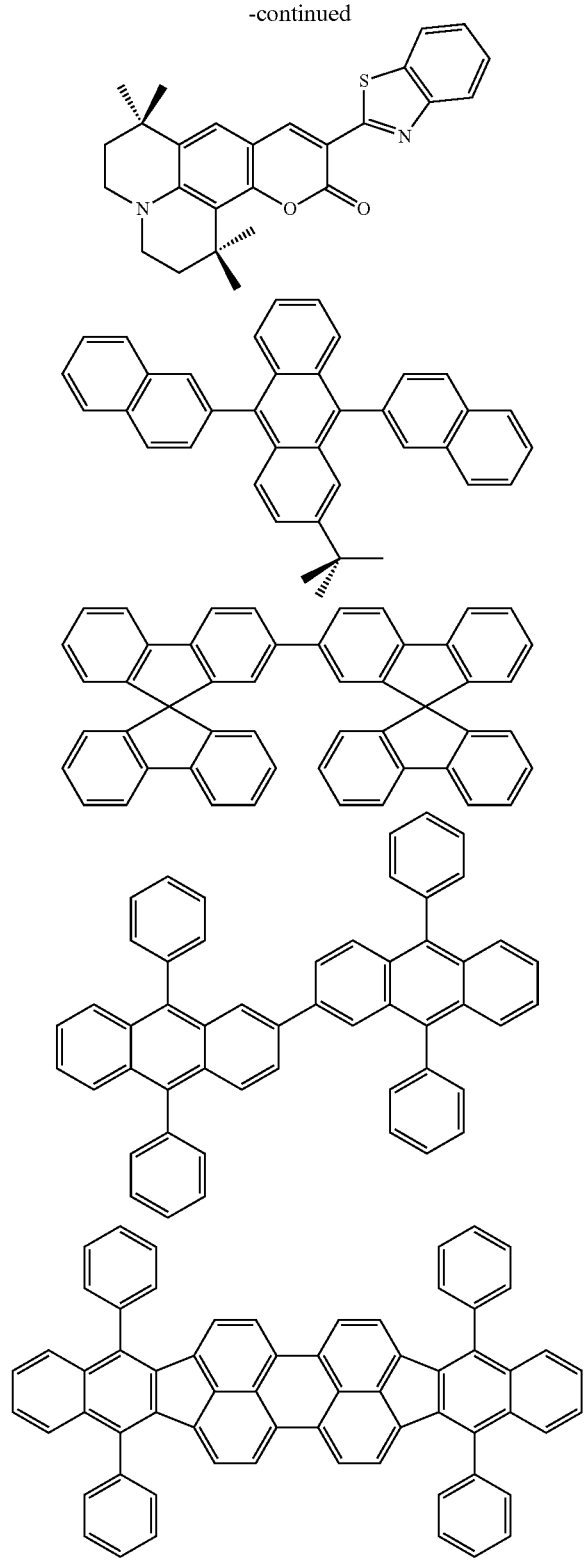

Meanwhile, when the light emitting material is a phosphorescent light emitting material, a combination of a host material and a guest material is given as the phosphorescent light emitting material. In addition, the guest material is preferably a material containing an organic metal complex including at least one metal selected from ruthenium, rhodium, palladium, silver, rhenium, osmium, iridium, platinum, and gold. Such organic metal complex is known in the patent literatures and the like, and it is possible to use a complex selected therefrom.

Examples of the phosphorescent light emitting material for providing high light emission efficiency include complexes such as Ir(ppy)$_3$, complexes such as Ir(bt)$_2$·acac$_3$, and complexes such as PtOEt$_3$, the complexes each having a noble metal element such as Ir as a central metal. The phosphorescent light emitting material is specifically exemplified below, but is not limited thereto.

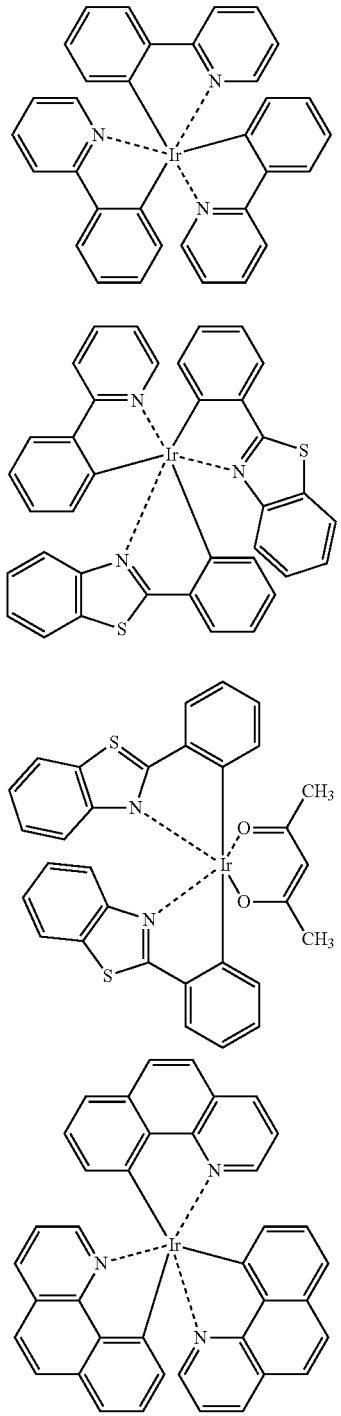

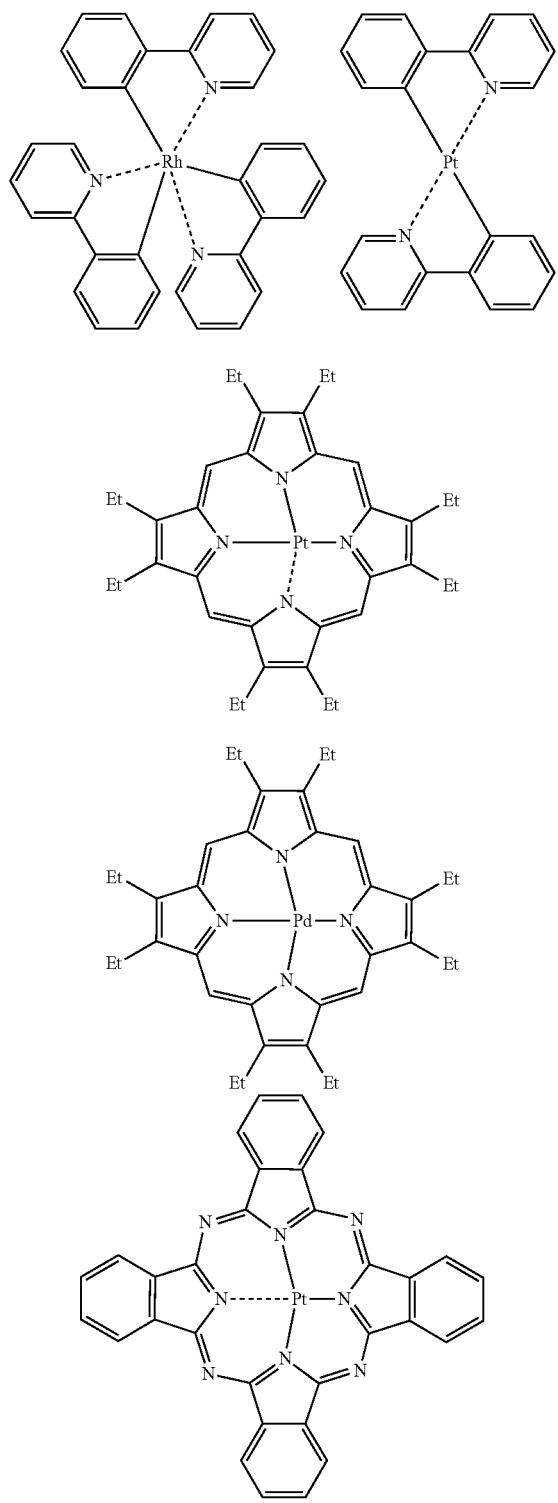

Organic electroluminescent elements having various emission wavelengths may be produced by using different kinds of light emitting materials.

In the case where the light emitting material is used as a dopant, the amount of the material in the light emission layer falls within the range of preferably 0.1 to 50 wt %, more preferably 1 to 30 wt %.

As the host material in the light emission layer, a known host material or the like may be used, and the polymer of the present invention may be used as the host material. In addition, the polymer of the present invention may be used as the host material, and in this case, the polymer of the present invention may be used in combination with another host material.

A host compound that may be used is preferably a compound that has a hole transporting ability or an electron transporting ability, is capable of preventing luminescence from having a longer wavelength, and has a higher glass transition temperature.

Such host materials are known through many patent literatures and the like, and hence the host material may be selected therefrom. Specific examples of the host material include, but not limited to, an indole derivative, a carbazole derivative, a triazole derivative, an oxazole derivative, an oxadiazole derivative, an imidazole derivative, a polyarylalkane derivative, a pyrazoline derivative, a pyrazolone derivative, a phenylenediamine derivative, an arylamine derivative, an amino-substituted chalcone derivative, a styrylanthracene derivative, a fluorenone derivative, a hydrazone derivative, a stilbene derivative, a silazane derivative, an aromatic tertiary amine compound, a styrylamine compound, an aromatic dimethylidene-based compound, a porphyrin-based compound, an anthraquinodimethane derivative, an anthrone derivative, a diphenylquinone derivative, a thiopyran dioxide derivative, a heterocyclic tetracarboxylic acid anhydride such as naphthaleneperylene, a phthalocyanine derivative, various metal complexes typified by a metal complex of an 8-quinolinol derivative, a metal phthalocyanine, and metal complexes of benzoxazole and benzothiazole derivatives, and polymer compounds such as a polysilane-based compound, a poly(N-vinylcarbazole) derivative, an aniline-based polymer, a thiophene oligomer, a polythiophene derivative, a polyphenylene derivative, a polyphenylene vinylene derivative, and a polyfluorene derivative.

A hole transporting compound that forms the hole transport layer is known through many patent literatures and the like, and hence the hole transporting compound that forms the hole transport layer may be selected therefrom. However, the cured product of the polymer of the present invention is advantageously used. In this case, another hole transporting compound such as a derivative of triphenylamine as a tertiary amine or a carbazole derivative may be used in combination with the cured product as required. For example, the cured product of the polymer of the present invention and one kind or two or more kinds of low-molecular-weight hole transporting compounds as additives may be blended to produce a composition. The hole transporting compound is specifically exemplified below, but is not limited thereto.

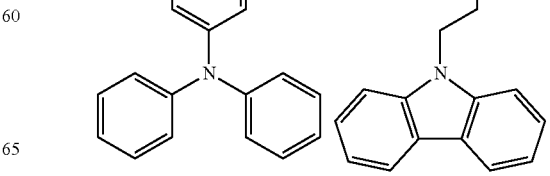

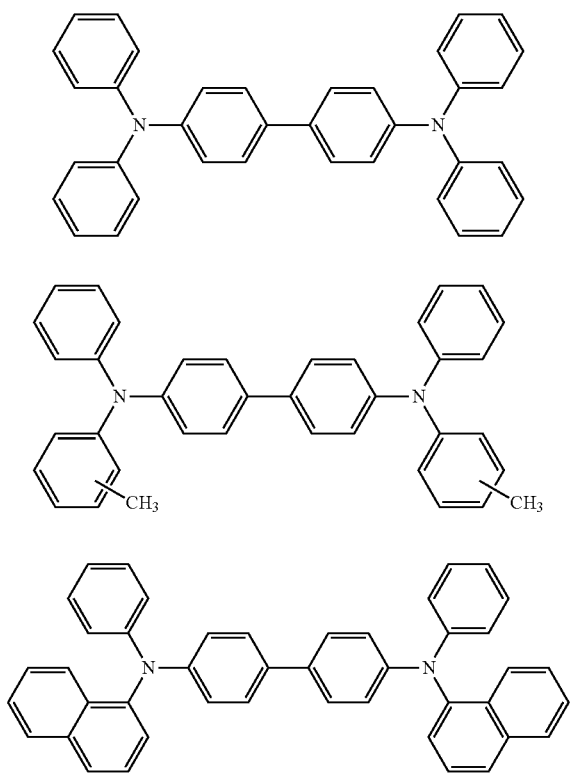

An electron transporting compound that forms the electron transport layer is exemplified by an oxadiazole derivative, an imidazole derivative, and a triazole derivative. As required, one kind or two or more kinds of those compounds may be blended to produce a composition. The electron transporting compound is specifically exemplified below, but is not limited thereto.

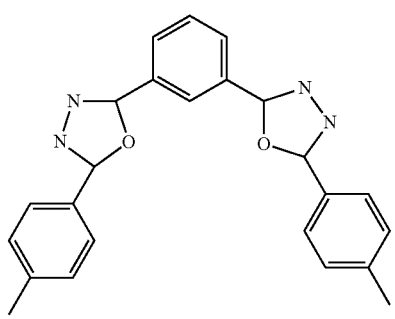

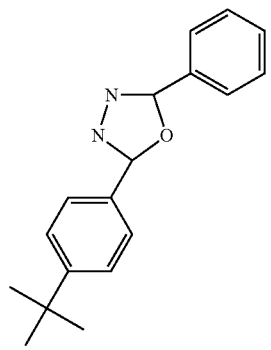

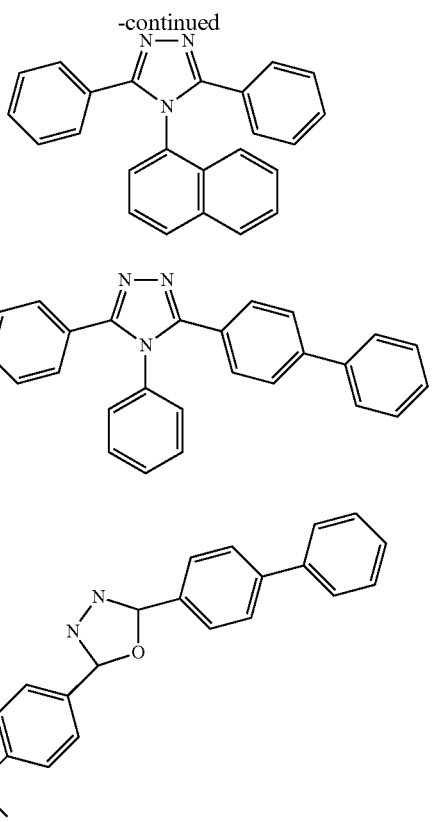

In addition, in order to improve efficiency of hole injection from the anode, a hole injection layer may be inserted between the anode and the hole transport layer or the light emission layer. As a hole injecting material that forms the hole injection layer, a conductive polymer such as a polythiophene derivative or a polypyrrole derivative may be used. Of those, a polythiophene derivative, poly(3,4-ethylenedioxythiophene)/polystyrene sulfonic acid (PEDOT/PSS) is preferred in view of the efficiency of hole injection. In the case of using the hole injection layer, the thickness of the hole injection layer is preferably 200 nm or less, more preferably 100 nm or less.

The anode supplies holes to the hole injection layer, the hole transport layer, the light emission layer, or the like, and is generally formed on a glass substrate. The material for the anode used in the present invention is not particularly limited, and specific examples thereof include a conductive metal oxide such as indium-tin oxide (ITO) or tin oxide, and a metal such as gold, silver, or platinum. Further, a commercially available glass with ITO may be used. The commercially available glass with ITO is usually washed with a cleaner aqueous solution and a solvent, and cleaned by a UV ozone irradiation apparatus or a plasma irradiation apparatus before use.

The cathode supplies electrons to the electron transport layer or the light emission layer. The material for the anode used in the present invention is not particularly limited, and specific examples thereof include a metal such as Li, Mg, Ca, or Al, and an alloy thereof such as an Mg—Ag alloy or an Mg—Al alloy.

The cathode and anode can be formed by a known method, i.e., a vacuum deposition method or a sputtering method. The thickness of the cathode is preferably 300 nm or less, more preferably 200 nm or less, while the thickness of the anode is preferably 200 nm or less, more preferably 100 nm or less.

In general, a spin coating method is used as a method of forming a layer of a polymer such as a polymer light emitting material, a polymer material for the hole transport layer, or a polymer material for the electron transport layer. In addition, as a technology for forming a large-area organic polymer layer, there are given, for example, an ink-jet method, a printing method, a spray coating method, and a dispenser method, but the technology is by no means limited thereto.

EXAMPLES

Hereinafter, the present invention is specifically described by way of examples. However, the present invention is not limited to these examples.

Compounds synthesized in Synthesis Examples and Examples were identified by one or more kinds of analysis methods selected from $^1$H-NMR (solvent: deuterated chloroform), FD-MS, GPC, TGA, DSC, UV, and IR analyses.

Example 1

Synthesis of Compound (1-1)

A polymer (1-1) is synthesized according to the following scheme (S1).

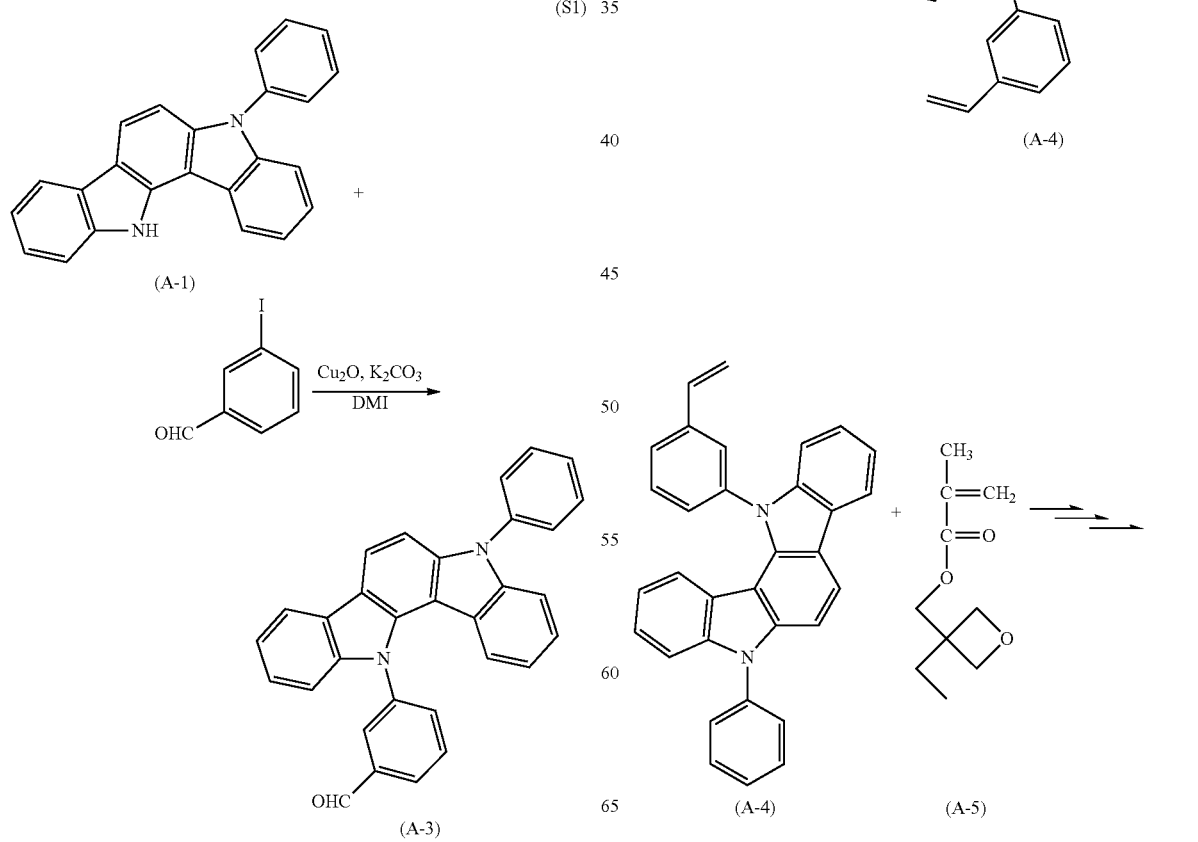
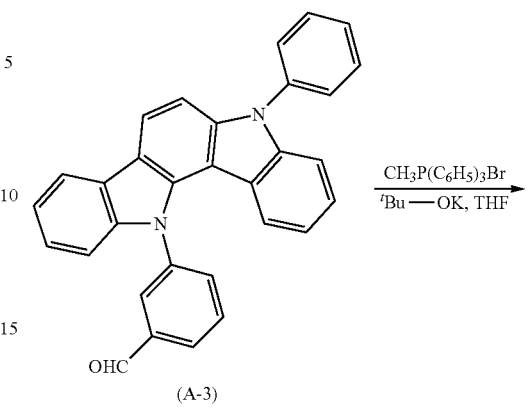

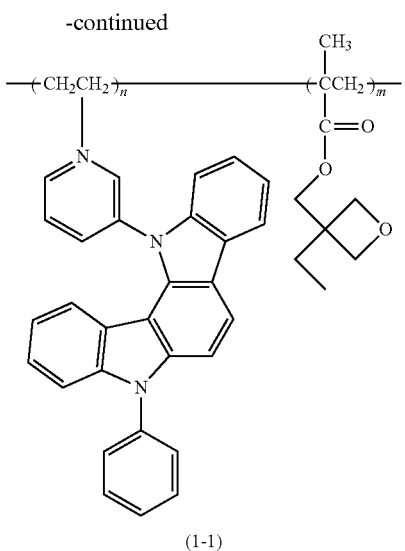

(1-1)

Under a nitrogen atmosphere, 54.7 mmol of a compound (A-1) and 109.3 mmol of a compound (A-2) were added to 180 g of dimethylimidazolidinone (DMI), and then 13.6 mmol (0.25 eq) of $Cu_2O$ and 82.0 mmol (1.5 eq) of $K_2CO_3$ were added to the resultant, followed by a reaction at 190° C. for 20 hr. The catalyst and the like were separated by filtration by passing the solution of reaction mixture through Celite, and then toluene and a saturated aqueous solution of NaCl were added to the filtrate, and the oil layer and aqueous layer were obtained. $MgSO_4$ was added to the organic layer, followed by separation by filtration. The solvents were removed under reduced pressure. MeOH was added to the residue, and then the mixture was subjected to reslurrying while being crushed. Thus, 18.5 g of a crude product were obtained. After that, the crude product was purified by silica gel column chromatography to provide 6.8 g of a compound (A-3).

Under a nitrogen atmosphere, a solution of 35.8 mmol (1.1 eq) of tBuOK in 30 ml of THF was dropped to 380 ml of tetrahydrofuran (THF) at room temperature over 20 min and then 32.6 mmol of the compound (A-3) were further subjected to a reaction for 100 min in the mixture in the presence of 34.2 mmol (1.05 eq) of methyl triphenylphosphonium bromide. After 400 ml of $H_2O$ had been added to the reaction liquid, THF was distilled off and then 200 ml of methylene chloride ($CH_2Cl_2$) were added to perform oil-water separation. A crude product obtained from the organic layer (recovered amount: 26.3 g) was purified by silica gel column chromatography to provide 7.2 g of a compound (A-4). 1H-NMR and FD-MS spectra of the compound (A-4) are shown below.

1H-NMR (400 MHz, CDCl3): δ (ppm); 8.171 (1H, d, 8 Hz), 8.152 (1H, dd, 8, 1 Hz), 7.54-7.72 (6H, m), 7.51-7.54 (2H, m), 7.16-7.35 (1H, 7H, m), 6.807 (1H, dd, 17, 11), 6.803 (1H, dt, 1, 8 Hz), 6.056 (1H, d, 8 Hz), 5.811 (1H, d, 17 Hz), 5.329 (1H, d, 11 Hz) FD-MS spectrum: 434 (M+, base)

The compound (A-4) and an oxetane group-containing monomer (OXMA: 3-ethyl-3-methacryloxymethyloxetane: manufactured by Ube Industries, Ltd.) were polymerized to synthesize the polymer (1-1) containing the compound (A-4) and the OXMA at 1:1. Specifically, 0.69 mmol of the compound (A-4) and 0.69 mmol of the OXMA were dissolved in 0.3 g of ethyl benzene, and then nitrogen purging was performed, followed by a reaction at 125° C. for 15 hr. After that, reprecipitation purification and reslurrying were repeated by using acetonitrile as a solvent, thereby removing an unreacted monomer. After that, reflux purification with a Soxhlet extractor was performed to provide 0.37 g of the polymer (1-1). The resultant polymer was identified by GPC and 1H-NMR. The polymer had an Mw of 30,400 in terms of polystyrene of GPC (tetrahydrofuran) and a molecular weight distribution of 2.29. A ratio "(A-4)/OXMA" between the repeating units of the polymer (1-1) derived from the compound (A-4) and the OXMA measured by 1H-NMR was 45/55 (mol/mol). A compound (A-5) is the OXMA.

Example 2

A film of poly(3,4-ethylenedioxythiophene)/polystyrene sulfonic acid (PEDOT/PSS): (manufactured by H. C. Starck, product name: Clevios PCH8000) as a hole injection layer (thickness; 25 nm) was deposited on a glass substrate with ITO having a thickness of 150 nm, which had been washed with a solvent and treated by UV and ozone. Next, the synthesized polymer (1-1) was dissolved in THF to prepare a 1 wt % solution, and a film having a thickness of 20 nm was formed to serve as a hole transport layer by a spin coating method. Next, the resultant film was cured by heating with a hot plate under an anaerobic condition at 150° C. for 1 hr. After that, a film of a light emission layer having a thickness of 40 nm was formed by co-deposition using tris(2-(p-tolyl) pyridine)iridium(III) as a light emission layer dopant and using 4,4'-bis(9H-carbazol-9-yl)biphenyl as a light emission layer host by a vacuum deposition apparatus at a dopant concentration of 0.6 wt %. After that, a film of $Alq_3$ having a thickness of 35 nm and a film of LiF/Al having a thickness of 170 nm as a cathode were formed using the vacuum deposition apparatus. The element was sealed in a glove box, to thereby produce an organic electroluminescent element.

An external power supply was connected to the organic electroluminescent element thus obtained and then a DC voltage was applied. As a result, the element was confirmed to have such light emission properties as shown in Table 1. A luminance shown in Table 1 is a value at 20 mA/cm². It should be noted that the maximum wavelength of the light emission spectrum of the element was 550 nm and green light emission derived from an iridium complex was observed.

Example 3

A film of poly(3,4-ethylenedioxythiophene)/polystyrene sulfonic acid (PEDOT/PSS): (manufactured by H. C. Starck, product name: Clevios PCH8000) was formed to serve as a hole injection layer at a thickness of 25 nm on a glass substrate with ITO having a thickness of 150 nm, which had been washed with a solvent and treated by UV and ozone. Next, the polymer (1-1) was formed into a film under the same conditions as those of Example 2. Then, tris(2-(p-tolyl)pyridine) iridium(III) was used as a light emission layer dopant and 4,4'-bis(9H-carbazol-9-yl)biphenyl was used as a light emission layer host, and a 1-wt % solution was prepared by dissolving the dopant and the host in toluene so that the concentration of the dopant became 0.6 wt %. The solution was formed into a film having a thickness of 40 nm by a spin coating method to serve as a light emission layer. At this time, no mixing of the hole transport layer and the light emission layer was observed. After that, a film of $Alq_3$ having a thickness of 35 nm and a film of LiF/Al having a thickness of 170 nm as a cathode were formed using the vacuum deposition apparatus. The element was sealed in a glove box, to thereby produce an organic electroluminescent element. The element was evaluated in the same manner as in Example 2.

Example 4

A polymer (1-2) containing the compound (A-4) and the OXMA at 7:3 was synthesized in the same manner as in Example 1. Specifically, 0.69 mmol of the compound (A-4) and 0.30 mmol of the OXMA were dissolved in 0.3 g of ethyl benzene, and then nitrogen purging was performed, followed by a reaction at 125° C. for 15 hr. After that, reprecipitation purification and reslurrying were repeated by using acetonitrile as a solvent, thereby removing an unreacted monomer. After that, reflux purification with a Soxhlet extractor was performed to provide 0.27 g of the polymer (1-2). The resultant polymer was identified by GPC and 1H-NMR. The polymer had an Mw of 18,100 in terms of polystyrene of GPC (tetrahydrofuran) and a molecular weight distribution of 2.24. A ratio "(A-4)/OXMA" between the repeating units of the polymer (1-2) derived from the compound (A-4) and the OXMA measured by 1H-NMR was 71/29 (mol/mol).

Example 5

An organic electroluminescent element was produced in the same manner as in Example 2 except that the polymer (1-2) was used as a hole transport layer instead of the polymer (1-1).

Example 6

An organic electroluminescent element was produced in the same manner as in Example 3 except that the polymer (1-2) was used as a hole transport layer instead of the polymer (1-1).

Comparative Example 1

An element was produced in the same manner as in Example 2 except that the polymer (1-1) was not used.

Comparative Example 2

An organic electroluminescent element was produced in the same manner as in Example 3 except that: a hole transport layer was formed by using the following compound (B-1) described in Patent Literature 3; and photopolymerization was performed by applying UV with a UV irradiation apparatus of an AC power supply system for 90 sec after the formation of the hole transport layer.

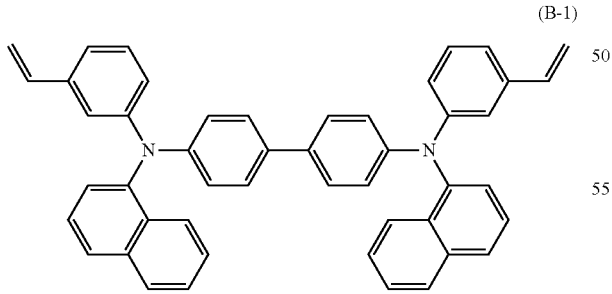

(B-1)

Comparative Example 3

An organic electroluminescent element was produced in the same manner as in Example 3 except that: the following compound (B-2) described in Patent Literature 4 was synthesized by a method described in Patent Literature 4; and the compound was used in a hole transport layer.

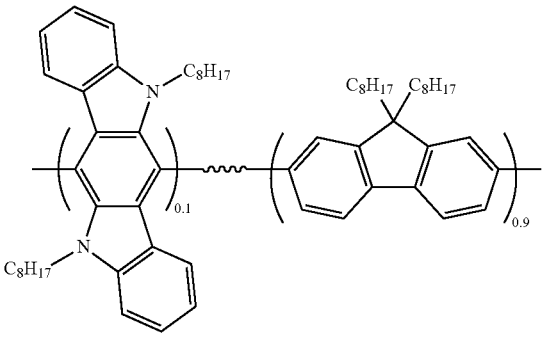

(B-2)

Example 7

A polymer (2-1) is synthesized according to the following scheme (S2).

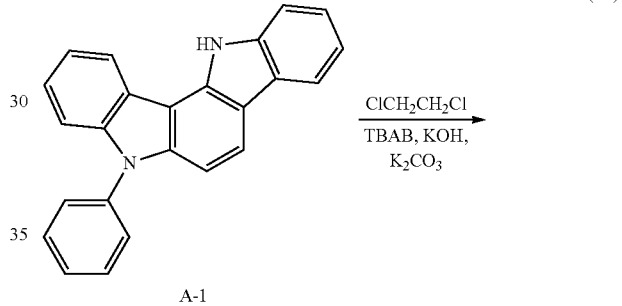

(S2)

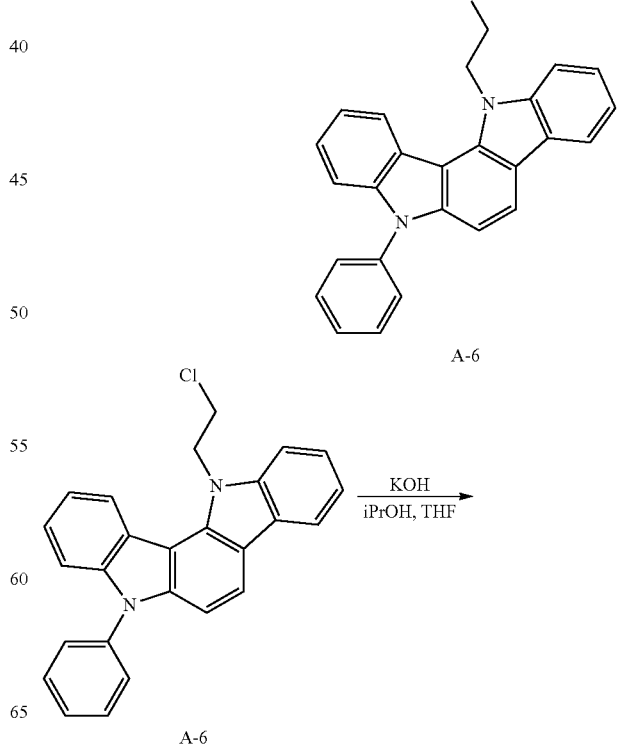

-continued

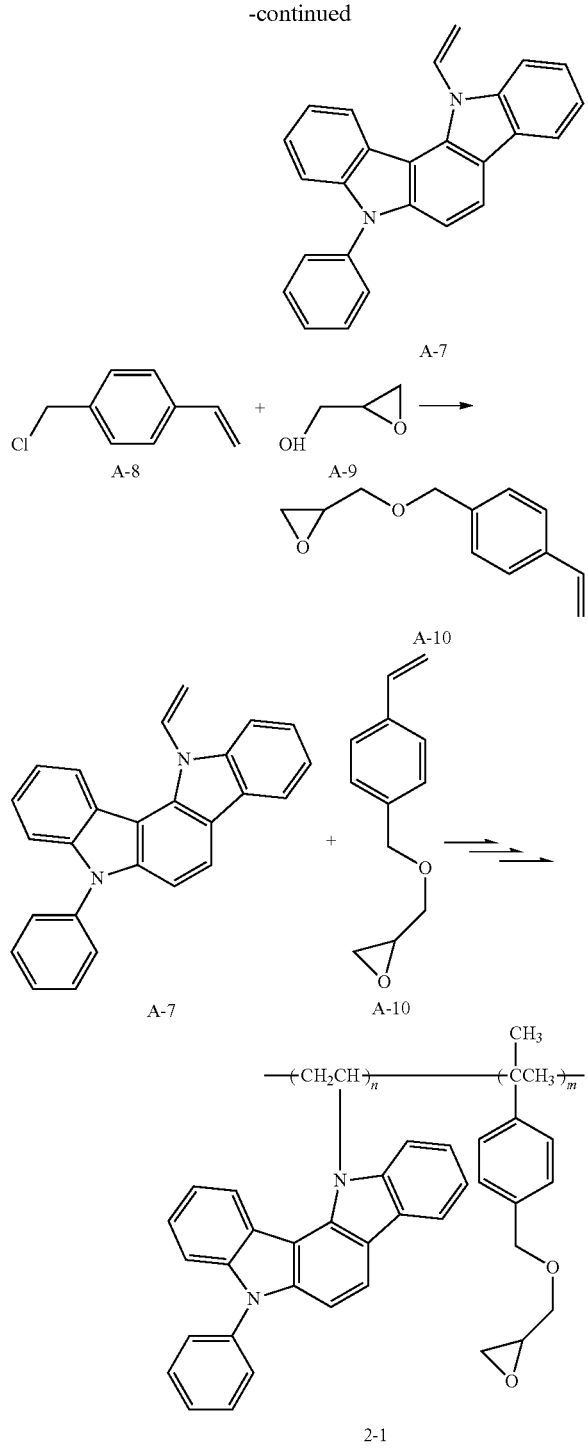

Under a nitrogen atmosphere, 30.0 g of 1,2-dichloroethane were added to 2.00 g (6.02 mmol) of the compound (A-1) in a 100-ml recovery flask, and the mixture was stirred at a bath temperature of 50° C. 0.76 g (2.36 mmol) of tetrabutylammonium bromide, 17.56 g (314 mmol) of potassium hydroxide, and 15.8 g (114 mmol) of potassium carbonate were fed in four portions with stirring at a bath temperature of 50° C. for 101 hours. The mixture was cooled to room temperature, and the solid matter was separated by filtration. The resultant filtrate was distilled off under reduced pressure. The residue was purified by silica gel column chromatography, to thereby obtain 1.93 g (yield 81%) of a compound (A-6) as white powder.

Under a nitrogen atmosphere, 2.59 g (6.56 mmol) of the compound (A-6), 125.0 g of isopropyl alcohol, 50.0 g of tetrahydrofuran, 36 mg (0.33 mmol) of hydroquinone, and 12.5 g (223 mmol) of potassium hydroxide were fed to a 300-ml recovery flask equipped with a Dimroth condenser, and the mixture was refluxed with heating for 23 hours at a bath temperature of 90° C. The mixture was cooled to room temperature, and 200 g of distilled water were added thereto. Isopropyl alcohol and tetrahydrofuran were distilled off under reduced pressure. The solution was subjected to extraction with 250 g of dichloromethane four times, and the extract was dried with anhydrous magnesium sulfate. The solid matter was subjected to suction filtration, and the solvent was distilled off under reduced pressure, to thereby obtain 5.48 g of a crude product. The product was purified by silica gel column chromatography and recrystallized twice with dichloromethane/isopropyl alcohol, to thereby obtain 2.10 g (yield 89%) of the compound (A-7). 1H-NMR (400 MHz, CDCl₃): δ (ppm); 8.725 (1H, d, 8 Hz), 8.083 (1H, br d, 8 Hz), 8.066 (1H, d, 8 Hz), 7.861 (1H, dd, 10, 16 Hz), 7.832 (1H, br d, 8 Hz), 7.657 (2H, t, 8 Hz), 7.598 (2H, d, 8 Hz), 7.542 (1H, t, 8 Hz), 7.448 (1H, t, 8 Hz), 7.398 (2H, m), 7.315 (3H, m), 5.671 (1H, d, 16 Hz), 5.664 (1H, d, 10 Hz) FD-MS spectrum: 358 (M+, base)

A compound (A-10) was synthesized by a method disclosed in Journal of the American Chemical Society; vol. 132; nb. 43; (2010); p. 15096-15098.

1H-NMR (400 MHz, CDCl₃): δ (ppm); 7.398 (2H, d, J=8), 7.309 (2H, d, J=8), 6.713 (1H, dd, J=11, 18), 5.748 (1H, dd, J=1, 18), 5.243 (1H, dd, J=1, 11), 4.603 (1H, 1H, d, J=12), 4.546 (1H, d, J=12), 3.765 (1H, dd, J=3, 12), 3.431 (1H, dd, J=6, 12), 3.189 (1H, m), 2.805 (1H, dd, J=4, 5), 2.621 (1H, dd, J=3, 5)

The polymer (2-1) was synthesized by copolymerizing the compound (A-7) and the compound (A-10). Specifically, 0.69 mmol of the compound (A-7) and 0.69 mmol of the compound (A-10) were dissolved in 0.3 g of ethyl benzene, and then nitrogen purging was performed, followed by a reaction at 125° C. for 15 hr. After that, reprecipitation purification and reslurrying were repeated by using acetonitrile as a solvent, thereby removing an unreacted monomer. After that, reflux purification with a Soxhlet extractor was performed to provide 0.45 g of the polymer (2-1). The resultant copolymer was identified by GPC and 1H-NMR. The polymer had an Mw of 25,900 in terms of polystyrene of GPC (tetrahydrofuran) and a molecular weight distribution of 2.31. A ratio "(A-7)/(A-10)" between the repeating units of the polymer (2-1) derived from the compound (A-7) and the compound (A-10) measured by 1H-NMR was 52/48 (mol/mol).

Example 8

An organic electroluminescent element was produced in the same manner as in Example 2 except that the polymer (2-1) was used as a hole transport layer instead of the polymer (1-1).

Example 9

An organic electroluminescent element was produced in the same manner as in Example 3 except that the polymer (2-1) was used as a hole transport layer instead of the polymer (1-1).

Example 10
A polymer (3-1) is synthesized according to the following scheme (S3).
(S3)
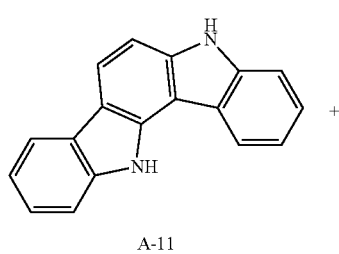
A-11
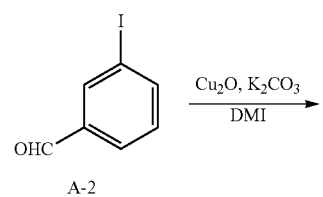
A-2
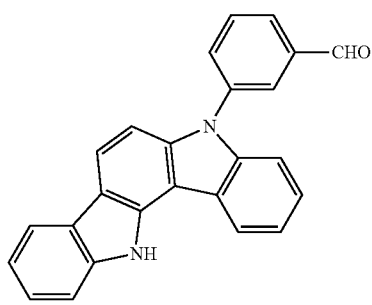
A-12
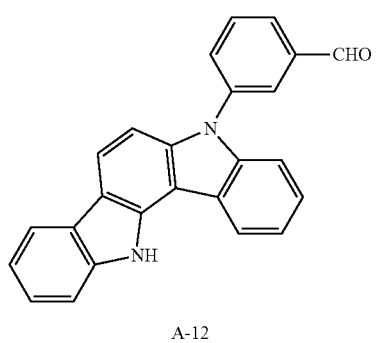
A-12
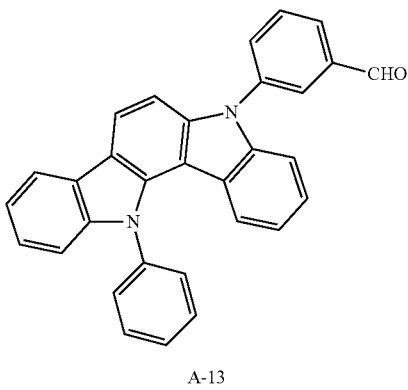
A-13
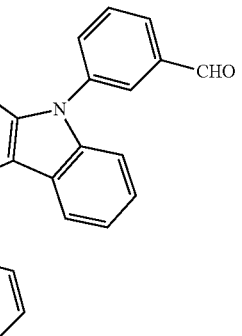
A-13
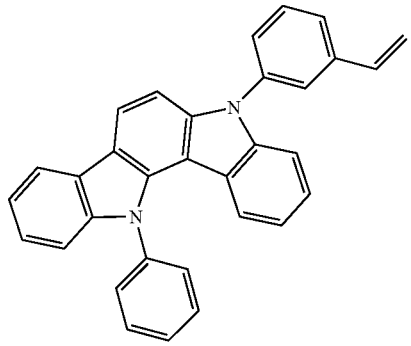
A-14
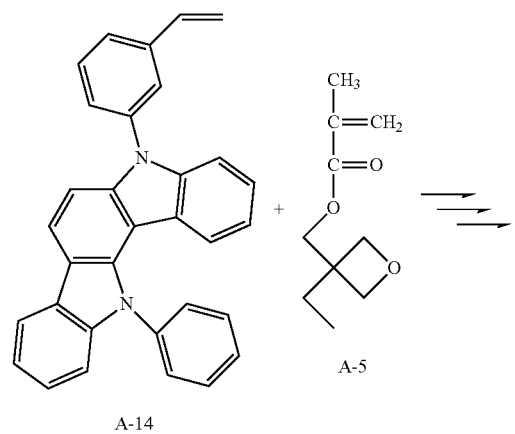
A-14    A-5

-continued

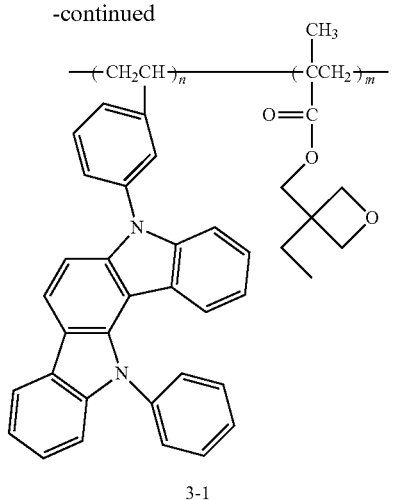

3-1

7.3 g (yield: 64%) of a compound (A-14) as white powder were obtained by performing a reaction and a posttreatment in the same manner as in Example 1 except that under a nitrogen atmosphere, a compound (A-12) was synthesized by using 27.8 g (108 mmol) of the compound (A-11) and 25.0 g (108 mmol) of 3-iodobenzaldehyde, and then 48.7 g (239 mmol) of iodobenzene were caused to react with the compound. The 1H-NMR and FD-MS spectra of the compound (A-14) are shown below.

1H-NMR (400 MHz, CDCl$_3$), δ (ppm); 8.171 (1H, d, 9 Hz), 8.149 (1H, dd, 8, 2 Hz), 7.55-7.66 (8H, m), 7.469 (1H, dt, 8, 2 Hz), 7.28-7.38 (5H, m), 7.222 (1H, ddd, 8, 7, 1 Hz), 6.808 (1H, dd, 11, 18 Hz), 6.789 (ddd, 8, 7, 1 Hz), 5.940 (1H, dd, 8, 1 Hz), 5.831 (1H, dd, 18, 1 Hz), 5.355 (1H, d, 11 Hz) FD-MS spectrum 434 (M+, base)

The polymer (3-1) containing the compound (A-14) and the OXMA at 1:1 was synthesized by subjecting an oxetane group-containing monomer (OXMA: 3-ethyl-3-methacryloxymethyloxetane: manufactured by Ube Industries, Ltd.) to copolymerization in the same manner as in Example 1 except that the compound (A-14) was used. The resultant polymer was identified by GPC and 1H-NMR. The polymer had an Mw of 16,200 in terms of polystyrene of GPC (tetrahydrofuran) and a molecular weight distribution of 2.16. A ratio "(A-14)/OXMA" between the repeating units of the polymer (3-1) derived from the compound (A-14) and the OXMA measured by 1H-NMR was 47/53 (mol/mol).

Example 11

An organic electroluminescent element was produced in the same manner as in Example 2 except that the polymer (3-1) was used as a hole transport layer instead of the polymer (1-1).

Example 12

An organic electroluminescent element was produced in the same manner as in Example 3 except that the polymer (3-1) was used as a hole transport layer instead of the polymer (1-1).

Each element evaluation was performed in the same manner as in Example 2. Table 1 shows a polymer or compound used in a hole transport layer (HTL), a light emission layer production system, and the results of the evaluations.

TABLE 1

| | HTL compound | Layer production system | Luminance (cd/m$^2$) | Voltage (V) |
|---|---|---|---|---|
| Example 2 | (1-1) | Dry | 6299 | 8.7 |
| 3 | (1-1) | Wet | 2615 | 9.2 |
| 5 | (1-2) | Dry | 3939 | 8.7 |
| 6 | (1-2) | Wet | 1662 | 9.3 |
| 8 | (2-1) | Dry | 5526 | 8.9 |
| 9 | (2-1) | Wet | 2467 | 9.5 |
| 11 | (3-1) | Dry | 5944 | 8.8 |
| 12 | (3-1) | Wet | 1723 | 9.5 |
| Comparative Example 1 | None | Dry | 2300 | 7.9 |
| 2 | (B-1) | Wet | 800 | 10.5 |
| 3 | (B-2) | Wet | None | — |

INDUSTRIAL APPLICABILITY

The use of the cured product of the polymer of the present invention in an organic layer of an organic electroluminescent element improves the hole injecting performance, electron resistance, and charge transporting performance of the element, and makes the element excellent in light emission efficiency. In addition, the use enables easy production of a large-area element because the use enables the lamination of an organic layer containing any other material as an upper layer by application. The organic electroluminescent element using the cured product of the polymer is excellent in light emission efficiency. Accordingly, the element may be applied to an organic electroluminescent element to be used in, for example, a lighting device, image display device, or back light for a display device, and hence its technical value is large.

The invention claimed is:

1. A polymer for an organic electroluminescent element, which is represented by the following general formula (1), the polymer comprising an indolocarbazole structure and a polymerizable group as pendants in a repeating unit constituting a main chain, wherein the polymer has a weight-average molecular weight of 1,000 to 1,000,000:

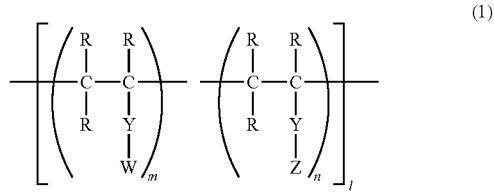

where R's each represent a hydrogen atom or a monovalent organic group, Y represents a divalent linking group, Z represents a substituted or unsubstituted indolocarbazolyl group having a bonding at an N-position, W represents a polymerizable group, m and n represent abundance molar ratios, and m represents 1 to 95 mol % and n represents 5 to 99 mol %, and l represents an average number of repetitions and represents 2 to 10,000.

2. A polymer for an organic electroluminescent element according to claim 1, wherein, in the general formula (1): R's each represent a hydrogen atom, a C$_1$ to C$_{20}$ alkyl group, a C$_1$ to C$_{20}$ alkoxy group, a C$_6$ to C$_{30}$ aryl group, a C$_6$ to C$_{30}$ aryloxy group, a C$_7$ to C$_{36}$ arylalkyl group, a C$_7$ to C$_{36}$ arylalkyloxy group, a C$_3$ to C$_{30}$ heteroaryl group, a C$_3$ to C$_{30}$ heteroaryloxy group, a C$_4$ to C$_{36}$ heteroarylalkyl group, a C$_4$ to C$_{36}$ heteroarylalkyloxy group, or a C$_3$ to C$_{30}$ cycloalkyl group, and may be identical to or different from each other; and Y represents a single bond, a C$_1$ to C$_{20}$ alkylene group, R²—Ar¹—R², OR²—Ar¹, Ar¹—R²O, OR²—Ar¹—R²O, O—Ar¹, Ar¹—O, O—Ar¹—O, R²—O—R², CO, or COO, R²'s each independently represent a single bond or a $C_1$ to $C_{10}$ alkylene group, and Ar¹ represents a $C_6$ to $C_{30}$ arylene group or a $C_3$ to $C_{30}$ heteroarylene group.

3. A polymer for an organic electroluminescent element according to claim 1, wherein Z in the general formula (1) represents one or two or more kinds selected from indolocarbazolyl groups represented by the following formulae (2) to (7):

(2)
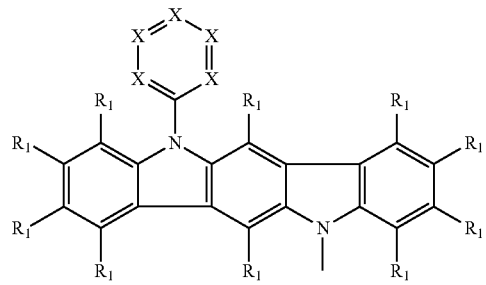

(3)
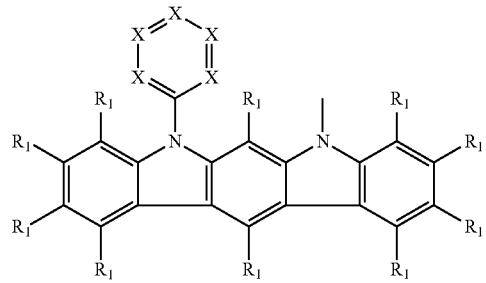

(4)
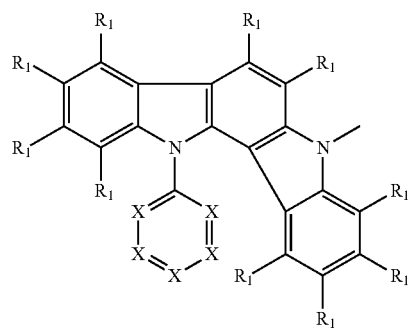

(5)
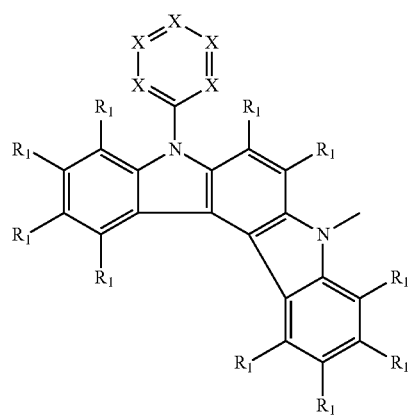

(6)
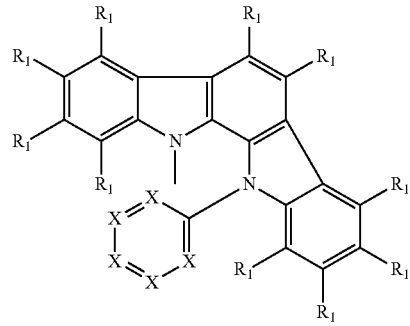

(7)
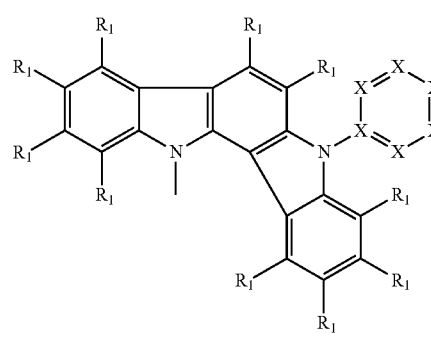

in the formulae (2) to (7), X's each independently represent N or C-L, L's each independently represent a hydrogen atom, a $C_1$ to $C_{20}$ alkyl group, a $C_6$ to $C_{30}$ aryl group, a $C_3$ to $C_{30}$ heteroaryl group, or a $C_{12}$ to $C_{60}$ diarylamino group, and $R_1$'s each independently represent a hydrogen atom, a $C_1$ to $C_{20}$ alkyl group, a $C_1$ to $C_{20}$ alkoxy group, a $C_6$ to $C_{30}$ aryl group, a $C_6$ to $C_{30}$ aryloxy group, a $C_7$ to $C_{36}$ arylalkyl group, a $C_7$ to $C_{36}$ arylalkyloxy group, a $C_3$ to $C_{30}$ heteroaryl group, a $C_3$ to $C_{30}$ heteroaryloxy group, a $C_4$ to $C_{36}$ heteroarylalkyl group, a $C_4$ to $C_{36}$ heteroarylalkyloxy group, or a $C_3$ to $C_{30}$ cycloalkyl group.

4. A polymer for an organic electroluminescent element according to claim 1, wherein W in the general formula (1) represents a radical polymerizable group or a cation polymerizable group.

5. A polymer for an organic electroluminescent element according to claim 1, wherein W in the general formula (1) represents at least one group selected from a vinyl group, a substituted vinyl group substituted with an alkyl group having 1 to 10 carbon atoms, an epoxy group, a substituted epoxy group substituted with an alkyl group having 1 to 10 carbon atoms, an oxetane group, and a substituted oxetane group substituted with an alkyl group having 1 to 10 carbon atoms.

6. A polymer for an organic electroluminescent element according to claim 1, wherein W in the general formula (1) represents at least one group selected from a vinyl group, an isopropenyl group, an epoxy group, an oxetane group, and a substituted oxetane group.

7. A cured product, which is obtained by subjecting the polymerizable group of the polymer for an organic electroluminescent element according to claim 1 to a reaction to crosslink and cure the polymer.

8. An organic electroluminescent element, comprising organic layers between an anode layer and a cathode layer laminated on a substrate, wherein at least one of the organic layers contains the cured product according to claim 7.

9. An organic electroluminescent element according to claim 8, wherein the organic layer containing the cured product comprises a hole transport layer.

\* \* \* \* \*